US011751452B2

(12) United States Patent
Seki

(10) Patent No.: US 11,751,452 B2
(45) Date of Patent: Sep. 5, 2023

(54) DISPLAY DEVICE

(71) Applicant: Japan Display Inc., Tokyo (JP)

(72) Inventor: Hirokazu Seki, Tokyo (JP)

(73) Assignee: Japan Display Inc., Tokyo (JP)

(*) Notice: Subject to any disclaimer, the term of this patent is extended or adjusted under 35 U.S.C. 154(b) by 64 days.

(21) Appl. No.: 17/549,119

(22) Filed: Dec. 13, 2021

(65) Prior Publication Data

US 2022/0102474 A1  Mar. 31, 2022

Related U.S. Application Data

(62) Division of application No. 16/832,740, filed on Mar. 27, 2020, now Pat. No. 11,227,909, which is a
(Continued)

(30) Foreign Application Priority Data

Oct. 20, 2017  (JP) .................................. 2017-203819

(51) Int. Cl.
*H10K 50/81* (2023.01)
*H10K 59/131* (2023.01)
(Continued)

(52) U.S. Cl.
CPC .......... *H10K 59/131* (2023.02); *G06F 3/047* (2013.01); *G06F 3/0446* (2019.05); *H10K 50/81* (2023.02);
(Continued)

(58) Field of Classification Search
CPC ............... H01L 27/3276; H01L 27/323; H01L 51/5246; H01L 51/5206; H01L 51/5221;
(Continued)

(56) References Cited

U.S. PATENT DOCUMENTS

2002/0149074 A1  10/2002 Imaeda
2012/0262898 A1  10/2012 Yamada
(Continued)

FOREIGN PATENT DOCUMENTS

JP  2014-103151 A  6/2014
JP  2014-123640 A  7/2014

OTHER PUBLICATIONS

English translation of Japanese Office Action issued in related Japanese Patent Application No. 2017-203819 dated Aug. 31, 2021. 5 pages.

*Primary Examiner* — Moin M Rahman
(74) *Attorney, Agent, or Firm* — K&L Gates LLP

(57) ABSTRACT

According to one embodiment, a display device includes a first substrate, a second substrate opposing the first substrate, a wiring substrate connected to the first substrate, a cover member located on an opposite side to the first substrate so as to interpose the second substrate therebetween and a conductive layer maintained at a predetermined potential, and the first substrate includes an extension portion extending further from the second substrate, the wiring substrate is connected to the extension portion, the cover member includes a first surface opposing the extension portion, and the conductive layer overlaps the extension portion in plan view.

20 Claims, 19 Drawing Sheets

Related U.S. Application Data division of application No. 16/161,619, filed on Oct. 16, 2018, now Pat. No. 10,644,095.

(51) Int. Cl.

| | | |
|---|---|---|
| *G06F 3/047* | (2006.01) | |
| *G06F 3/044* | (2006.01) | |
| *H10K 50/82* | (2023.01) | |
| *H10K 50/84* | (2023.01) | |
| *H10K 50/86* | (2023.01) | |
| *H10K 50/844* | (2023.01) | |
| *H10K 50/842* | (2023.01) | |
| *H10K 59/40* | (2023.01) | |
| *G02F 1/1362* | (2006.01) | |
| *G09G 3/3266* | (2016.01) | |
| *H10K 50/856* | (2023.01) | |

(52) U.S. Cl.
CPC ............. *H10K 50/82* (2023.02); *H10K 50/84* (2023.02); *H10K 50/844* (2023.02); *H10K 50/8426* (2023.02); *H10K 50/86* (2023.02); *H10K 59/40* (2023.02); *G02F 1/136286* (2013.01); *G09G 3/3266* (2013.01); *H10K 50/8445* (2023.02); *H10K 50/856* (2023.02)

(58) Field of Classification Search
CPC ............. H01L 51/5281; H01L 51/5256; H01L 51/5271; H01L 51/5237; H01L 51/5253; H01L 51/5296; H01L 27/283; H01L 27/3274; H01L 27/1214–1296; H01L 29/41733; H01L 29/783; H01L 29/7831; H01L 29/786; H01L 2924/13069; H01L 29/0847; H01L 27/3202; H01L 27/3204; H01L 27/3209; H01L 27/3225; H01L 27/3251; H01L 27/3258; H01L 27/3262; H01L 27/3267; H01L 51/50; H01L 2227/32; H01L 2924/12044; H01L 27/32; H01L 27/3237; H01L 2227/03; G06F 3/044; G06F 3/047; G02F 1/136286; G09G 3/3266; H10K 10/46–491; H10K 50/00–88; H10K 59/00–95; H10K 65/00; H10K 71/00–861; H10K 85/00–791; H10K 2101/00–90; H10K 2102/00–361; H10K 59/10–221; H10K 59/125; H05K 2201/10136; B32B 2457/202

See application file for complete search history.

(56) References Cited

U.S. PATENT DOCUMENTS

| | | | |
|---|---|---|---|
| 2013/0083268 A1* | 4/2013 | Hirabayashi | ......... H04N 9/3105 353/30 |
| 2013/0242249 A1 | 9/2013 | Azuma et al. | |
| 2014/0176840 A1 | 6/2014 | Hashido | |
| 2017/0160581 A1 | 6/2017 | Matsuoka | |

* cited by examiner

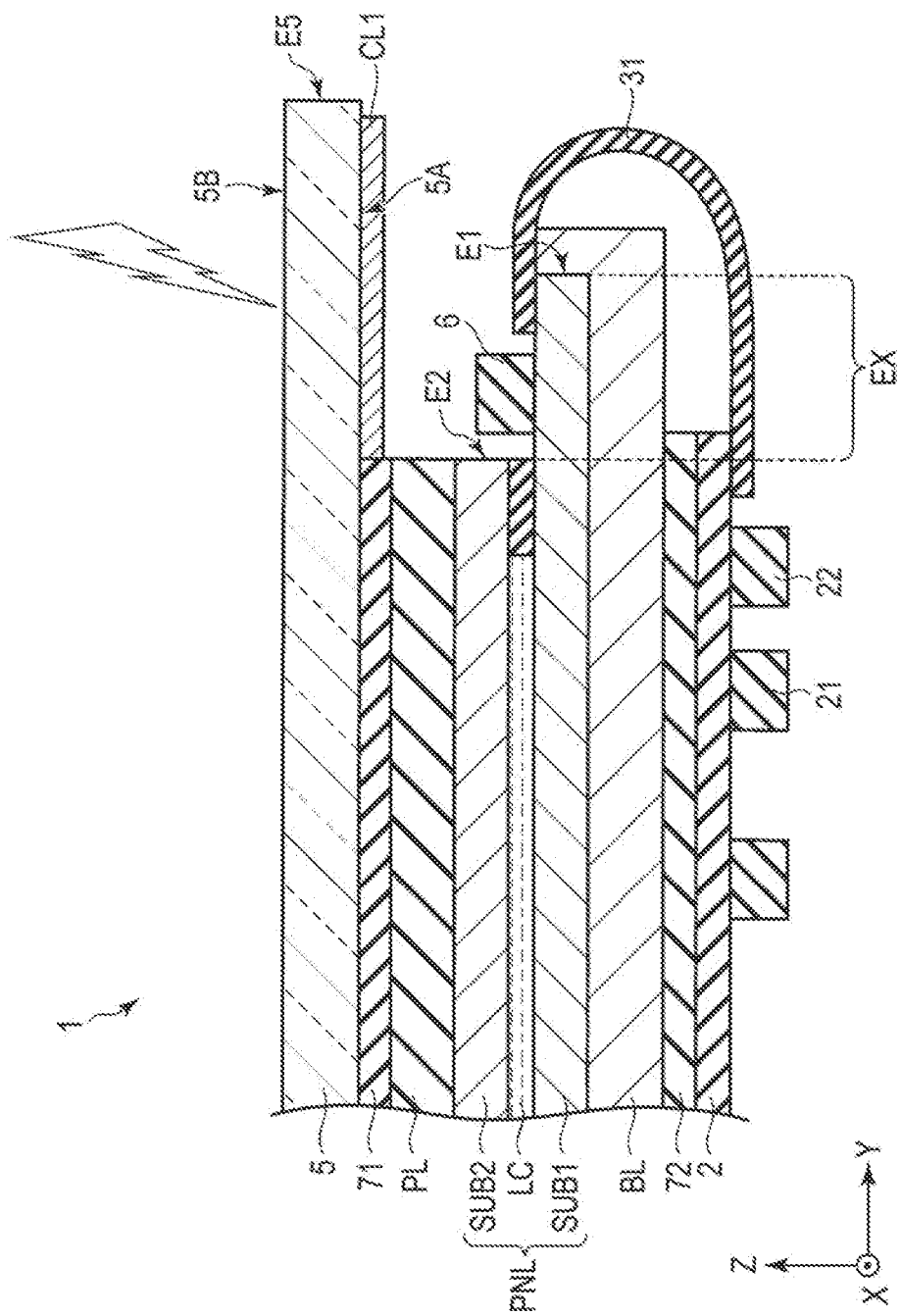
F I G. 2

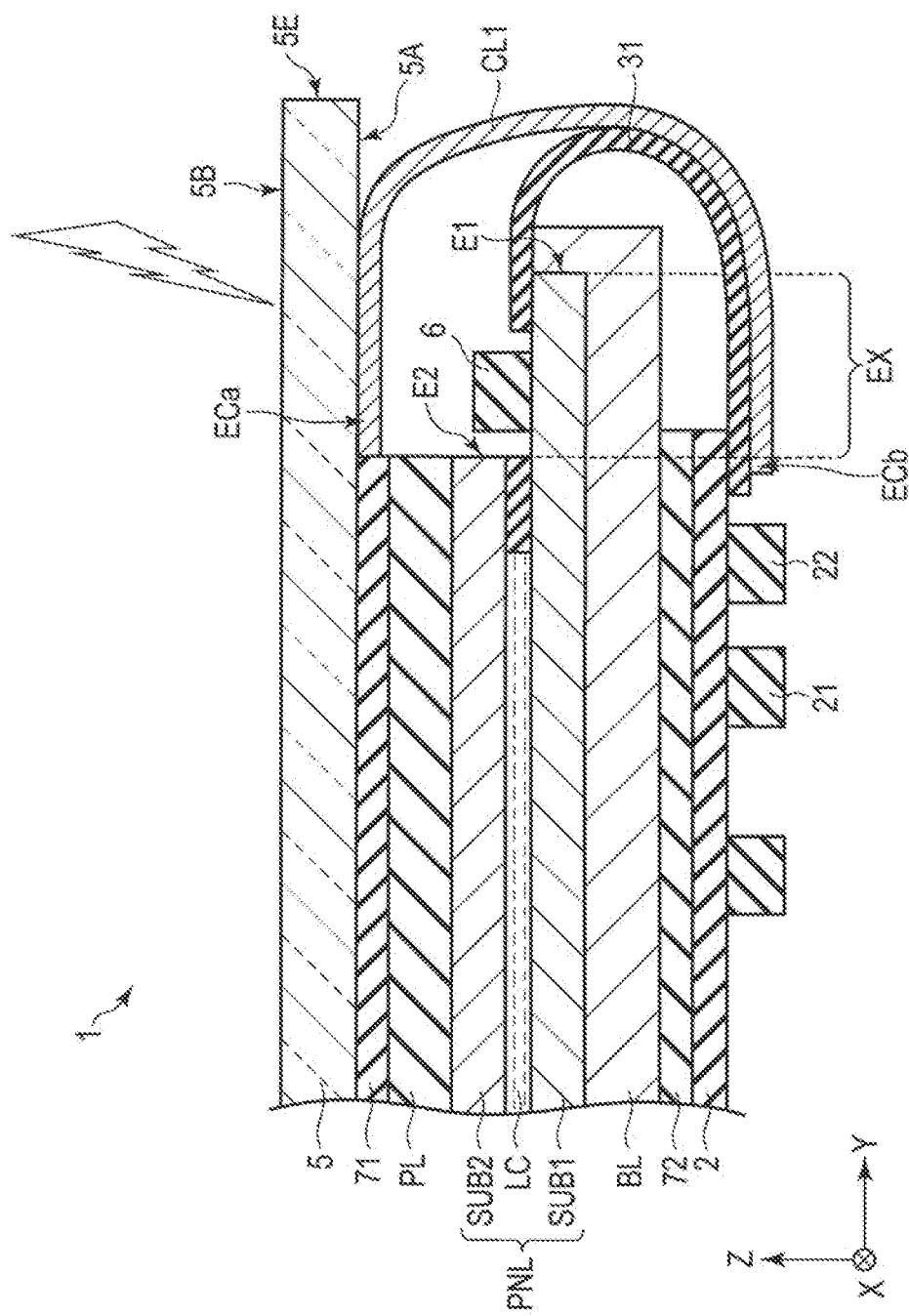
F I G. 12

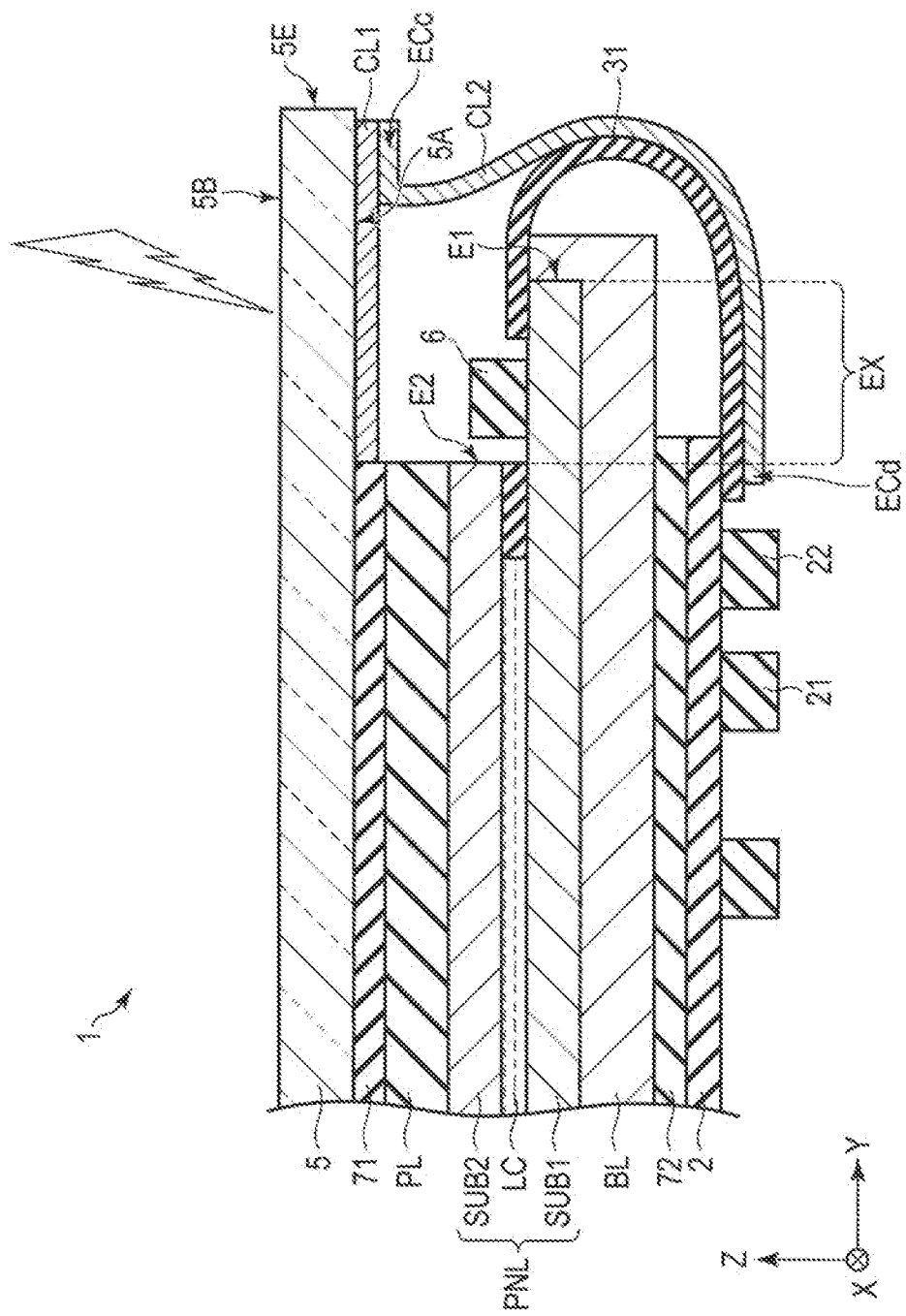
F I G. 15

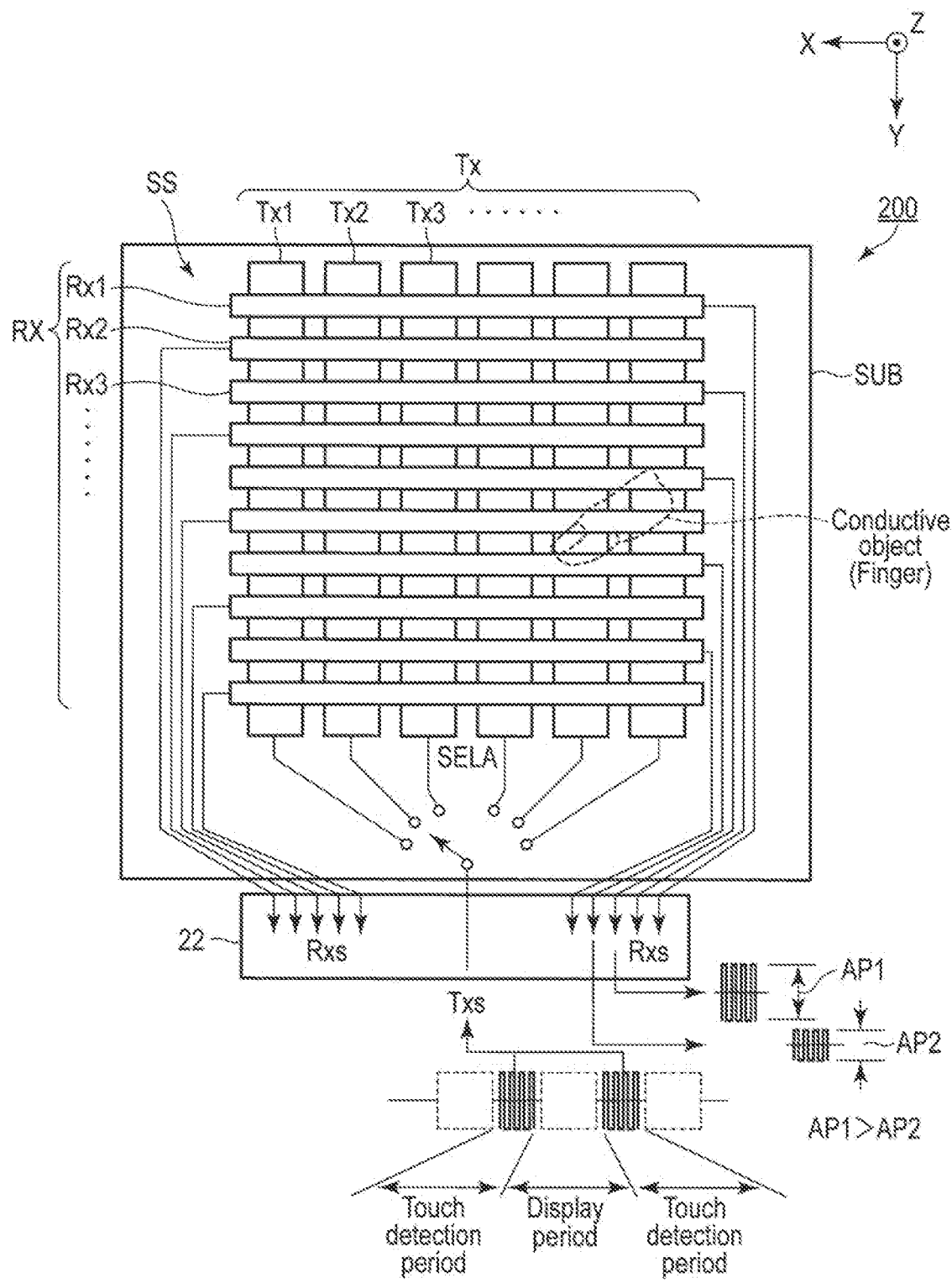
F I G. 18

DISPLAY DEVICE

CROSS-REFERENCE TO RELATED APPLICATIONS

This application is a divisional Ser. No. 16/832,740, filed on Mar. 27, 2020, which is a divisional of U.S. patent application Ser. No. 16/161,619, filed on Oct. 16, 2018, now U.S. Pat. No. 10,644,095, issued on May 5, 2020, which application is based upon and claims the benefit of priority from Japanese Patent Application No. 2017-203819, filed Oct. 20, 2017, the entire contents of which are incorporated herein by reference.

FIELD

Embodiments described herein relate generally to a display device.

BACKGROUND

Display devices such as liquid crystal display devices and the like comprise a plurality of scanning lines and signal lines. The scanning lines and signal lines are electrically connected to a driver for controlling display operation, and the like. In some cases, the driver is provided on the display panel. In such a display device, when, for example, high voltage is applied as a noise which comes from the outside, the operation of the driver is sometimes adversely influenced.

SUMMARY

The present application relates generally to a display device.

According to an embodiment, a display device includes a first substrate, a second substrate opposing the first substrate, a wiring substrate connected to the first substrate, a cover member located on an opposite side to the first substrate so as to interpose the second substrate therebetween and a conductive layer maintained at a predetermined potential, and the first substrate includes an extension portion extending further from the second substrate, the wiring substrate is connected to the extension portion, the cover member includes a first surface opposing the extension portion, and the conductive layer overlaps the extension portion in plan view.

BRIEF DESCRIPTION OF THE DRAWINGS

FIG. 2 is an enlarged view of a vicinity of a wiring substrate 31 shown in FIG. 1.

FIG. 12 is a plan view showing a third modified example of the display device 1.

FIG. 15 is a plan view showing a fifth modified example of the display device 1.

FIG. 18 is a plan view schematically showing a touch detection device of a mutual capacity system applied to the display device 1.

DETAILED DESCRIPTION

Figure 1:
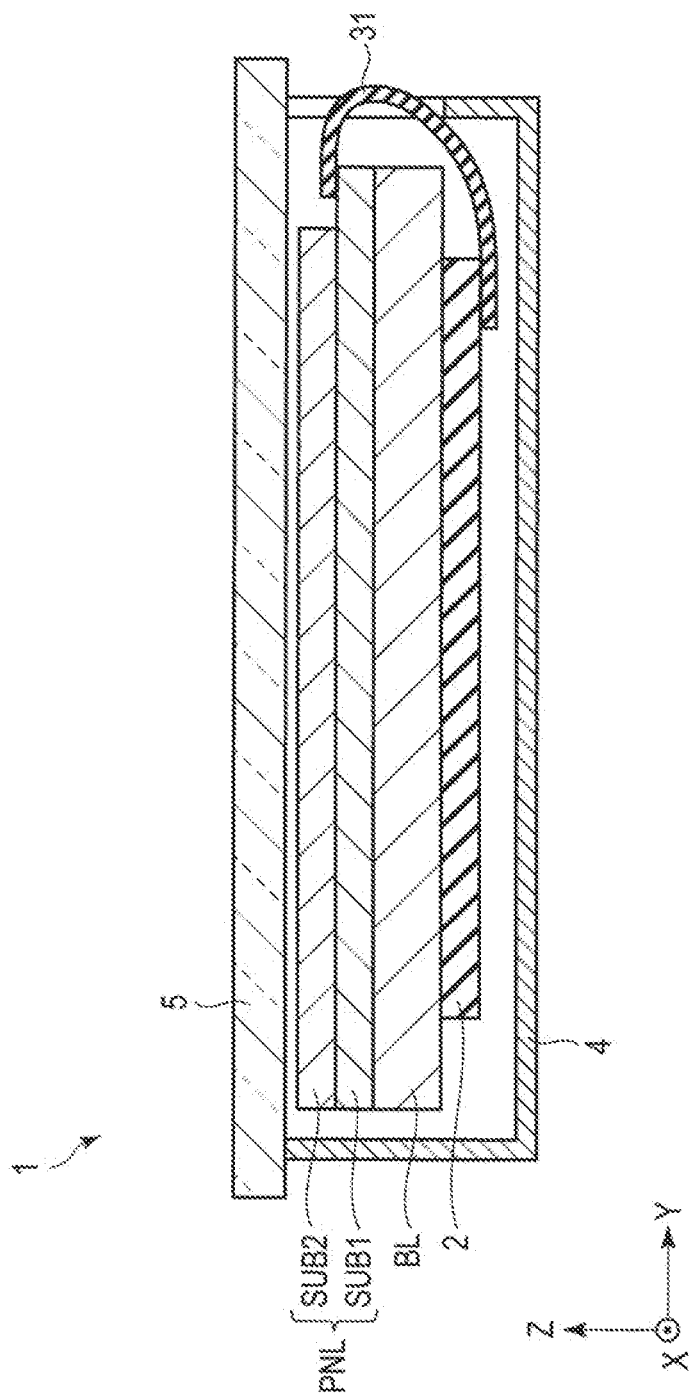
FIG. 1 is a cross section schematically showing a display device 1 of this embodiment.

In general, according to one embodiment, a display device comprises a first substrate, a second substrate opposing the first substrate, a wiring substrate connected to the first substrate, a cover member located on an opposite side to the first substrate so as to interpose the second substrate therebetween, and a conductive layer maintained at a predetermined potential, and the first substrate comprises an extension portion extending further from the second substrate, the wiring substrate is connected to the extension portion, the cover member comprises a first surface opposing the extension portion, and the conductive layer overlaps the extension portion in plan view.

According to another embodiment, a display device comprises a first substrate, a cover member opposing the first substrate, a wiring substrate connected to the first substrate and a conductive layer maintained at a predetermined potential, and the first substrate comprises an extension portion which connects the wiring substrate thereto, the cover member comprises a first surface opposing the extension portion, and the conductive layer overlaps the extension portion in plan view.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

In this embodiment, a display device comprising a touch detection function will be described. The touch detection function, which will be discussed here, is equivalent to detection of approaching or contacting of an object to be detected, with respect to the display device. The display device of this embodiment can be used in various devices such as smartphones, tablet terminals, mobile phones, notebook computers, and game consoles. The main structure described in this embodiment is applicable to a liquid crystal display device, a self-luminous display device such as an organic electroluminescent display device, Micro LED display device, and an electronic paper display device comprising an electrophoresis element, etc., a display device adopting micro-electromechanical systems (MEMS), and a display device adopting electrochromism.

FIG. 1 is a cross section schematically showing a display device 1 according to this embodiment. In the figure, a first direction X and a second direction Y are directions crossing each other, and a third direction Z is a direction crossing the first direction X and the second direction Y. For example, the first direction X, the second direction Y and the third direction Z are orthogonal to each other, but they may cross each other at an angle other than 90 degrees. The first direction X and the second direction Y correspond to a direction parallel to the surface of the display, and the third direction Z correspond to a thickness direction of the display device 1. In this specification, a direction indicated by the tip of the arrow along the third direction Z is referred to as upward (or simply, up), and a direction opposite to that indicated by the tip of the arrow is referred to as downward (or simply, down). Such expressions as "a second member on a first member" and "a second member below a first member" mean that the second member may be in contact with the first member or may be apart from the first member. Further, when it is assumed that an observation position at which the display device 1 is to be observed is located at the pointing end side of the arrow indicating the third direction Z, a view toward an X-Y plane defined by the first direction X and the second direction Y is referred to as a plan view.

The display device 1 comprises a display panel PNL, an illumination unit BL, a control substrate 2, a wiring substrate 31, a housing 4, a cover member 5 and the like.

Although the illustration thereof is omitted, the display device 1 comprises a sensor which detects approaching or contacting of an object to be detected, with respect to the display device 1, as will be described later. This embodiment is applicable to even a device which utilizes an exclusive touch panel independent of the display panel PNL, as the sensor, or a device which shares some of the parts with those of the display panel PNL.

The display panel PNL is, for example, an active-matrix liquid crystal display panel. The display panel PNL comprises a first substrate SUB1, a second substrate SUB2 and a liquid crystal layer LC (not shown) held between the first substrate SUB1 and the second substrate SUB2. For example, the display panel PNL displays images by selectively transmitting light irradiated from the illumination unit BL.

The illumination unit BL is located under the display panel PNL. The illumination unit BL comprises, for example, a light guide and a light source arranged along with an edge of the light guide.

The control substrate (control circuit board) 2 is located under the illumination unit BL, and is accommodated in the housing 4. On the control substrate 2, an IC chip which controls the touch detection function of the display device 1, a communication module for carrying out communications with the outside, a host device which controls operation of the display device 1 by various applications implemented therein, and the like are mounted as will be described later.

Note that the control substrate 2 may include an IC chip which controls the display function of the display panel PNL.

The wiring substrate 31 electrically connects the display panel PNL and the control substrate 2 to each other. For example, the wiring substrate 31 is a flexible printed circuit board (FPC). In the example illustrated, one end portion of the wiring substrate 31 is provided on one end portion of first substrate SUB1, and the other end portion of the wiring substrate 31 is provided on one end portion of the control substrate 2. Note that a part or entirety of each of the IC chip that controls the touch detection function described above, and the IC chip which controls display function may be mounted in the wiring substrate 31.

The cover member 5 is located on the display panel PNL. In the example illustrated, the cover member 5 covers the entire display panel PNL. The cover member 5 is formed from, for example, a transparent material such as glass or resin.

FIG. 2 is an enlarged view of a vicinity of the wiring substrate 31 shown in FIG. 1. The display device 1 further comprises a driver 6, a conductive layer CL1 (shield conductive layer), a polarizer PL, and adhesive layers 71 and 72, in addition to the display panel PNL, the illumination unit BL, the control substrate 2, the wiring substrate 31 and the cover member 5. Note that the housing 4 is not shown in FIG. 2.

In the display panel PNL, the first substrate SUB1 is larger than the second substrate SUB2. The first substrate SUB1 comprises an extension portion EX extending from the second substrate SUB2. In the example illustrated, the extension portion EX extends along the second direction Y.

The signal driver 6 is disposed on the extension portion EX. That is, in the second direction Y, the signal driver 6 is located between an end portion E1 of the first substrate SUB1 and an end portion E2 of the second substrate SUB2. More specifically, the signal driver 6 is provided on a side opposing the cover member 5 of the extension portion EX. The signal driver 6 controls the display operation of the display panel PNL.

The polarizer PL is located between the second substrate SUB2 and the cover member 5. The polarizer PL is adhered to the cover member 5 by the adhesive layer 71.

The control substrate 2 includes a host device 21, an IC chip 22, and the like. The host device 21 in which, for example, various applications are implemented, controls the operation of the display device 1. The IC chip 22 controls, for example, the touch detection function of the display panel PNL. The host device 21 and the IC chip 22 are provided on a surface opposite to a side opposing the illumination unit BL of the control substrate 2. The control substrate 2 is adhered to the housing of the illumination unit BL by the adhesive layer 72. Alternatively, the control substrate 2 is fixed with the illumination unit BL with a screw or the like, and the illumination unit BL is electrically connected to a ground potential of the control substrate 2.

The cover member 5 comprises a first surface 5A opposing the display panel PNL and a second surface 5B on an opposite side to the first surface 5A. The cover member 5 overlaps the extension portion EX entirely along the third direction Z. In other words, the end portion E2, the end portion E1, and the end portion E5 of the cover member 5 are arranged along the second direction Y in this order.

In this embodiment, the conductive layer CL1 is provided on the first side 5A and opposes at least the signal driver 6. In the example illustrated, the conductive layer CL1 overlaps the extension portion EX entirely along the third direction Z. Along the second direction Y, one end portion of the conductive layer CL1 is located between the end portion E1 and the end portion E5. The other end portion of the conductive layer CL1 is in contact with the adhesive layer 71.

The conductive layer CL1 is a sheet-like member formed from, for example, a metal material such as copper or aluminum. The conductive layer CL1 may comprise an adhesive surface having adhesion and may be adhered to the first surface 5A using an adhesive. Alternatively, the conductive layer CL1 may be formed by, for example, applying a paste of a conductive material containing a metal material such as silver. In this case, the conductive material may be applied directly to the first surface 5A, and the sheet-like member coated with the conductive material may be attached to the first surface 5A.

Figure 3:
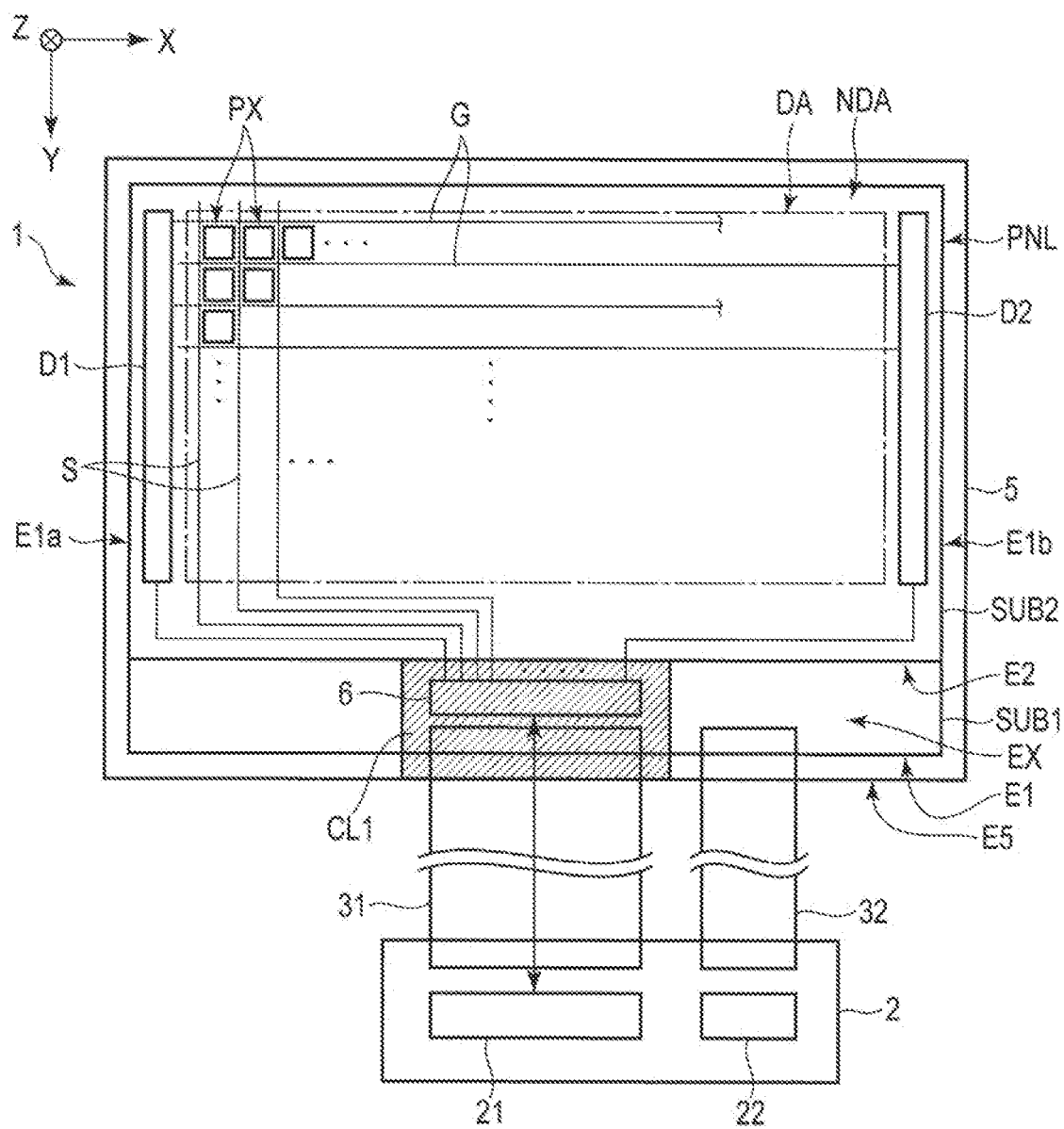
FIG. 3 is a plan view showing a configuration example of the display device 1.

FIG. 3 is a plan view showing a configuration example of the display device 1. FIG. 3 shows a plane parallel to the X-Y plane defined by the first direction X and the second direction Y.

The cover member 5 is, for example, a quadrangle and in the example illustrated, it is a rectangular shape whose length along the first direction X is greater than the length along the second direction Y. In the example illustrated, the end portion E5 extends along the first direction X.

The display panel PNL has substantially an identical shape to that of the cover member 5. That is, the display panel PNL is formed in a rectangular shape whose length along the first direction X is greater than the length along the second direction Y. In plan view, the display panel PNL entirely overlaps the cover member 5. In the example illustrated, the end portion E2 and the end portion E1 extend along the first direction X. The first substrate SUB1 comprises end portions E1$a$ and E1$b$ extending along the second direction Y. The extension portion EX corresponds to a region between the end portion E1 and the end portion E2.

The display panel PNL includes a display area DA and a non-display area NDA on an outer side of the display area DA. The display area DA is located within a region where the first substrate SUB1 and the second substrate SUB2 are superimposed on each other, and comprises a plurality of pixels PX. The non-display area NDA surrounds the display area DA.

The display panel PNL comprises a plurality of scanning lines G, a plurality of signal lines S, and pixels PX in the display area DA. The scanning lines G extend along the first direction X, and are arranged along the second direction Y at intervals. The signal lines S extend along the second direction Y, and are arranged along the first direction at intervals. The pixels PX are each located in a vicinity of an intersection of a respective scanning line G and a respective signal line S, and contain a switching element, a pixel electrode and the like, as will be described later.

The scanning lines G and the signal lines S are lead out to the extension portion EX through the non-display area NDA, and are electrically connected to the signal driver 6. In the example illustrated, the scanning line G lead out to an end portion E1$a$ side is connected to a gate driver D1, and a scanning line G lead out to an end portion E1$b$ side is connected to a gate driver D2. The gate drivers D1 and D2 are connected to the signal driver 6. Further, the signal lines S are connected to the signal driver 6 through the end portion E1 side of the non-display area NDA. The signal driver 6 is electrically connected to the host device 21 provided in the control substrate 2 via the wiring substrate 31. The signal driver 6 may be IC chip 22. In the example illustrated, the display device 1 comprises a wiring substrate 32 which connects the display panel PNL and the control substrate 2 to each other. The wiring substrate 32 electrically connects the sensor, which will be described later, and the IC chip 22 to each other.

In this embodiment, the conductive layer CL1 is provided in a region which overlaps at least a part of the signal driver 6 in plan view. In the example illustrated, the conductive layer CL1 overlaps the signal driver 6 entirely. More specifically, the conductive layer CL1 overlaps the extension portion EX, but does not overlap the second substrate SUB2. That is, the conductive layer CL1 is located in a region between the end portion E2 and the end portion E5. In the example illustrated, the conductive layer CL1 is formed into a rectangular shape substantially, but it suffices if the conductive layer CL1 overlaps at least the signal driver 6, and the shape thereof is not particularly limited.

Figure 4:
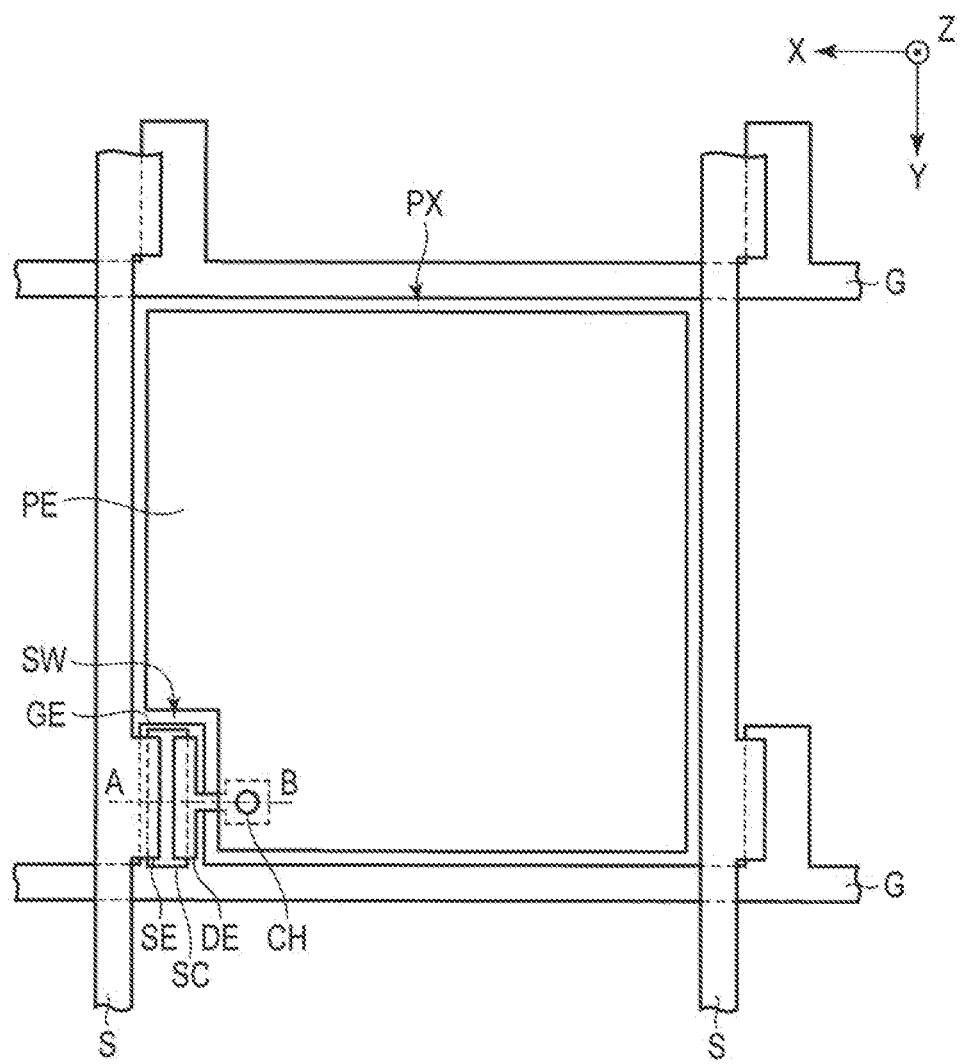
FIG. 4 is a plan view showing a configuration example of a pixel PX shown in FIG. 3.

FIG. 4 is a plan view showing a configuration example of the pixels PX shown in FIG. 3. In the example illustrated, the pixels PX are each defined by each respective adjacent pair of scanning lines G arranged along the first direction Y and each respective adjacent pair of signal lines S arranged along the second direction X.

The pixels PX each comprise a switching element SW and a pixel electrode PE. The switching element SW is, for example, a thin film transistor and is electrically connected to the respective scanning line G and the respective signal line S. More specifically, the switching element SW comprises a gate electrode GE, a source electrode SE and a drain electrode DE. The gate electrode GE is formed integrally with the scanning line G. In the example illustrated, the switching element SW is of a bottom gate type, in which the gate electrode GE is located under the semiconductor layer SC, but it may be a top gate type in which the gate electrode GE is located above the semiconductor layer SC. The semiconductor layer SC is formed of, for example, amorphous silicon, but may be formed of polycrystalline silicon or an oxide semiconductor. The source electrode SE is formed integrally with the signal line S, and is in contact with the semiconductor layer SC. The drain electrode DE is spaced from the source electrode SE and is in contact with the semiconductor layer SC. The pixel electrode PE is superimposed on the drain electrode DE, and is in contact with the drain electrode DE in the contact hole CH.

Figure 5:
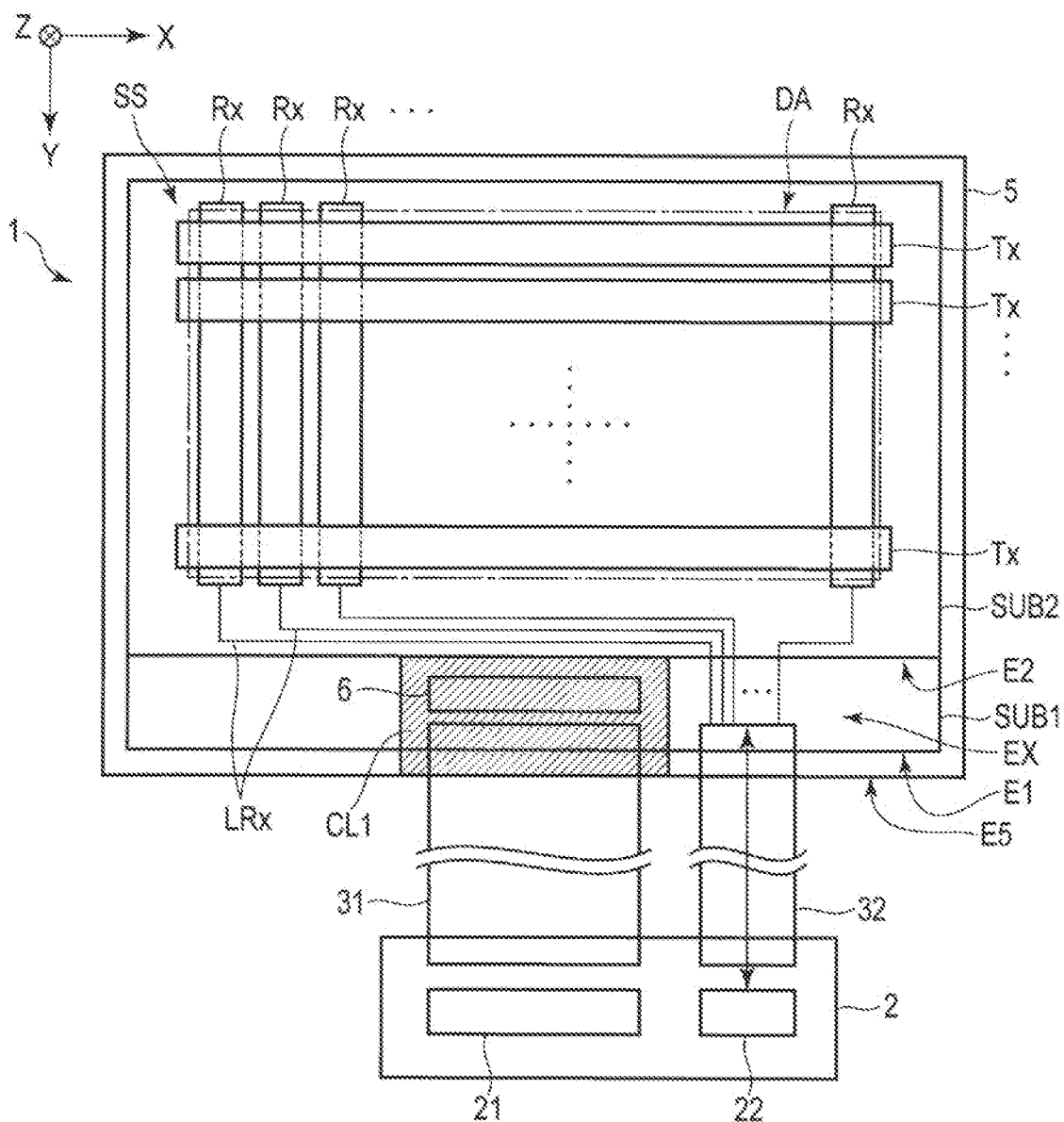
FIG. 5 is a plan view showing a configuration example of a sensor SS provided in the display device 1.

FIG. 5 is a plan view showing a configuration example of a sensor SS provided in the display device 1.

The sensor SS comprises a plurality of first electrodes Rx for detecting touch operation, and a plurality of second electrodes Tx arranged so as to cross these first electrodes Rx. In the example illustrated, the first electrodes Rx each extend along the second direction Y and are arranged along the first direction X so as to be spaced apart from each other. The second electrodes Tx each extend along the first direction X, and are arranged along the second direction Y so as to be spaced apart from each other. The first electrodes Rx and the second electrodes Tx are disposed in a region which substantially overlaps the display area DA in plan view. The first electrodes Rx are disposed on, for example, the second substrate SUB2. The second electrodes Rx are disposed on, for example, the first substrate SUB1. When the second electrodes Tx are disposed on the first substrate SUB1, the second electrodes Tx can be used as the common electrode of the display panel PNL.

The sensor SS comprises outer peripheral wiring lines connected to the first electrodes Rx and the second electrodes Tx, respectively. FIG. 5 shows some of the outer peripheral wiring lines LRx connected to the first electrodes Rx. In the example illustrated, the outer peripheral wiring lines LRx are lead out to an end portion E2 side and are electrically connected to the wiring substrate 32 through the extension portion EX. The first electrodes Rx and the second electrodes Tx are controlled by the IC chip 22 mounted on the control substrate 2 through the wiring substrate 32.

The arrangement of the first electrodes Rx and the second electrodes Tx is not limited to that of the example provided above. For example, both of the first electrodes Rx and the second electrodes Tx may be disposed on the second substrate SUB2, or at least one side of the first electrodes Rx and the second electrodes Tx may be formed on, for example, the first surface 5A of the cover member 5.

Figure 6:
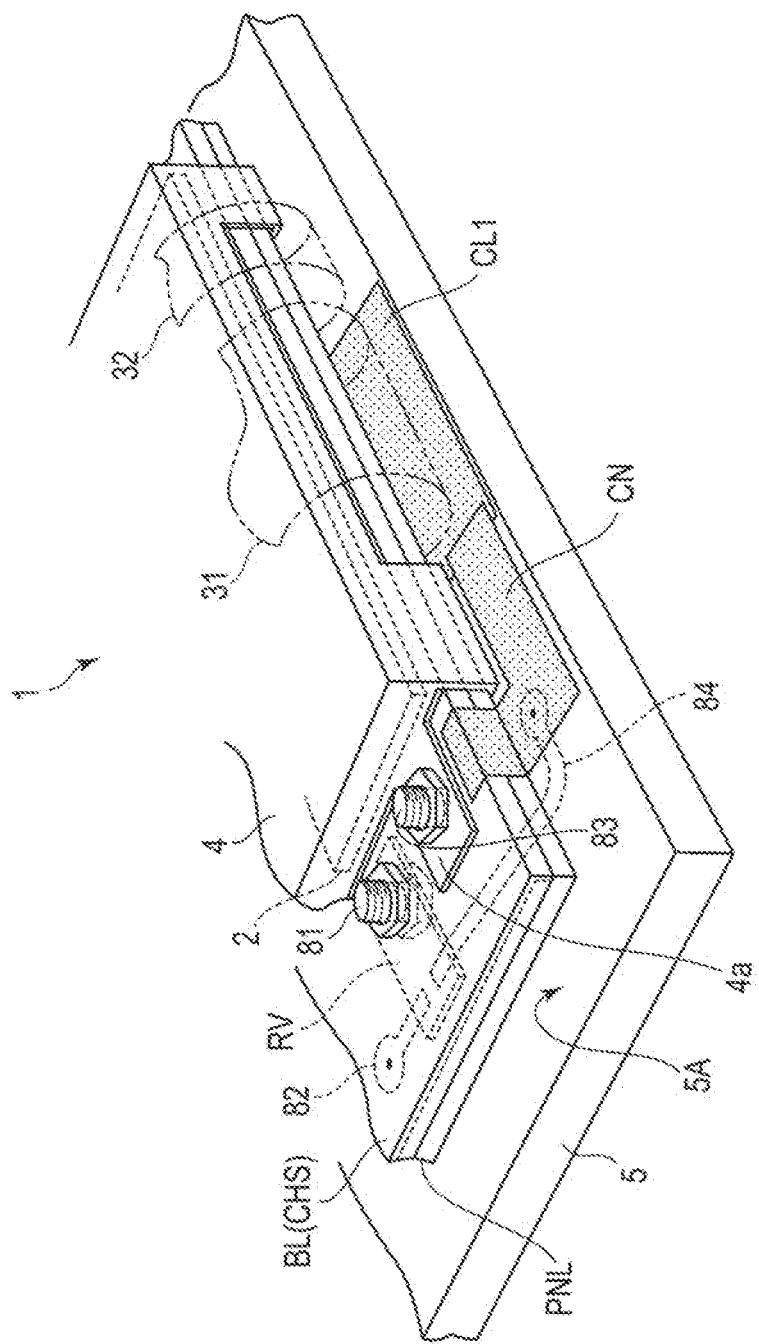
FIG. 6 is a perspective view showing an appearance of the display device 1.

FIG. 6 is a perspective view showing an appearance of the display device 1. FIG. 6 shows an opposite side to the display surface of the display device 1, that is, a first surface 5A side of the cover member 5.

The illumination unit BL comprises a housing CHS which accommodates a light source, a light guide and the like. In this embodiment, the conductive layer CL1 is electrically connected to the housing CHS which constitutes the illumination unit BL. In the example illustrated, the conductive layer CL1 is connected to the housing CHS through a conductive layer CN (Lead-out conductive layer). More specifically, the conductive layer CN is disposed along an edge of the housing 4 and is in contact with conductive layer CL1 and the housing CHS. The conductive layer CN may be formed from a material identical to or different from that of the conductive layer CL1. Note that the conductive layer CL1 and the conductive layer CN may be formed integrally as one body. That is, the conductive layer CL1 may extend even to the illumination unit BL so as to be in contact with the case of the illumination unit BL.

The housing CHS is maintained at a reference potential. The reference potential is, for example, the ground potential. In the example illustrated, the housing CHS is internally in contact with a reference potential member RV maintained at, for example, the ground potential. For example, the reference potential member RV is fixed with a screw 81 so as to be in contact with the housing CHS. Note that the method of connecting the reference potential member RV and the housing CHS to each other is not limited to that of the example illustrated. For example, the reference potential member RV and the housing CHS may be electrically connected through a conductive member 82.

The housing 4 is formed of, for example, a metal such as aluminum and is in contact with the housing CHS. For example, the housing 4 comprises an extension portion 4a extending parallel to the main surface of the display panel PNL. The extension portion 4a is fixed to the housing CHS with a screw 83 while in contact with the housing CHS. Thus, the housing 4 can be set to the same potential to that of the housing CHS. Therefore, the control substrate 2 accommodated in the housing 4 can operate without being interfered from outside.

Note that, for example, when the display device 1 is not a liquid crystal display, the conductive layer CL1 does not need to be connected to the housing CHS. The conductive layer CL1 may be connected to the reference potential member RV, for example, through a conductive member 84. In the example illustrated, the conductive member 84 is in contact with the conductive layer CN and the reference potential member RV.

Figure 7:
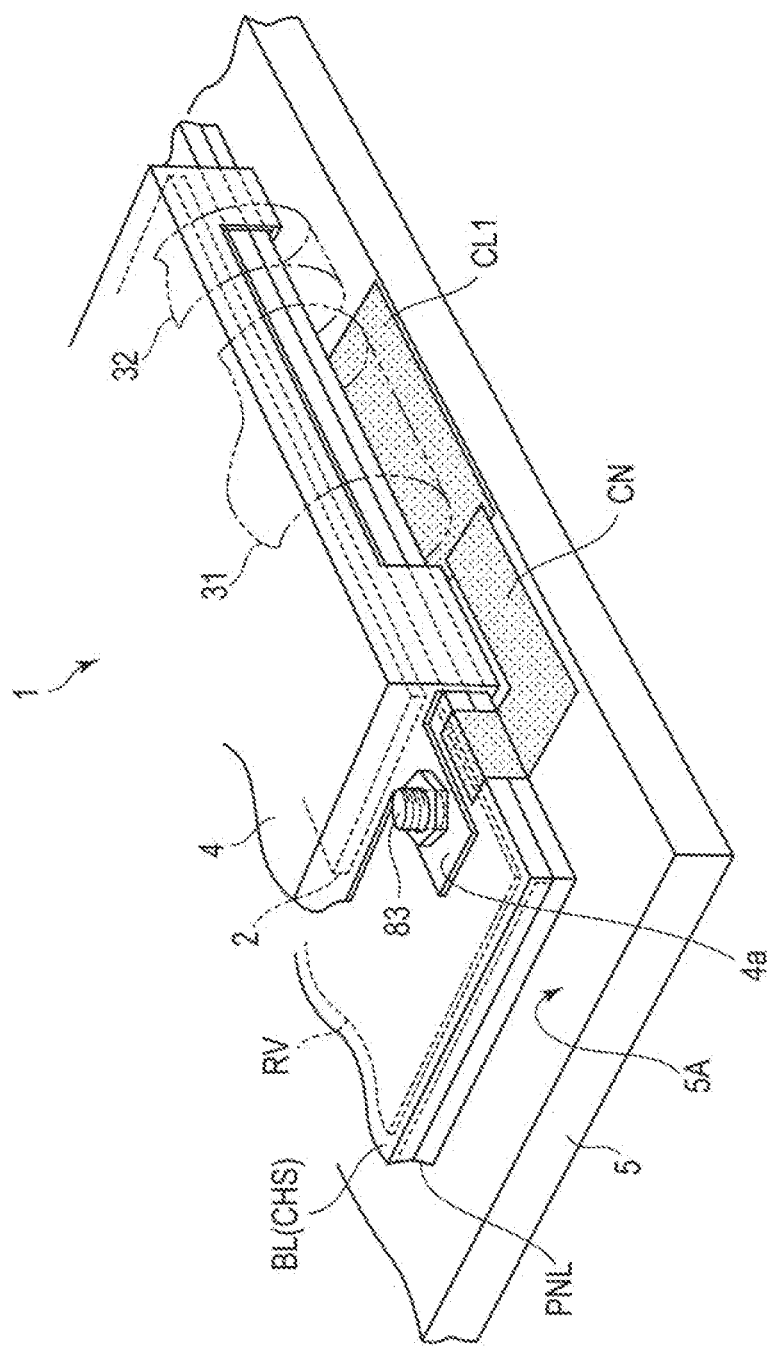
FIG. 7 is a perspective view showing another example of the appearance of the display device 1.

FIG. 7 is a diagram showing another example of the appearance of the display device 1. The example shown in FIG. 7 is different from that of FIG. 6 in that the housing CHS and the reference potential member RV are not connected through the screw 81 or the conductive member 82. In this case, the housing CHS is capacitively coupled with the reference potential member RV.

According to this embodiment, the conductive layer CL1 is provided in a region of the first surface 5A of the cover member 5, which overlaps at least the signal driver 6 along the third direction Z. The conductive layer CL1 is maintained at the ground potential. With this structure, even if voltage is applied to a second surface 5B side by static discharge or the like, it is possible to suppress adverse influence on the operation of the signal driver 6, caused by the voltage, with the structure shown in FIG. 2, for example, in which the conductive layer CL1 maintained at the ground potential is prepared in the region which overlaps the signal driver 6. Thus, even if voltage is applied to the second surface 5B, for example, flickering of images displayed on the display panel PNL can be suppressed, thereby improving the display quality of the display device 1.

Modified examples of the display device 1 will be described with reference to FIGS. 8 to 15.

Figure 8:
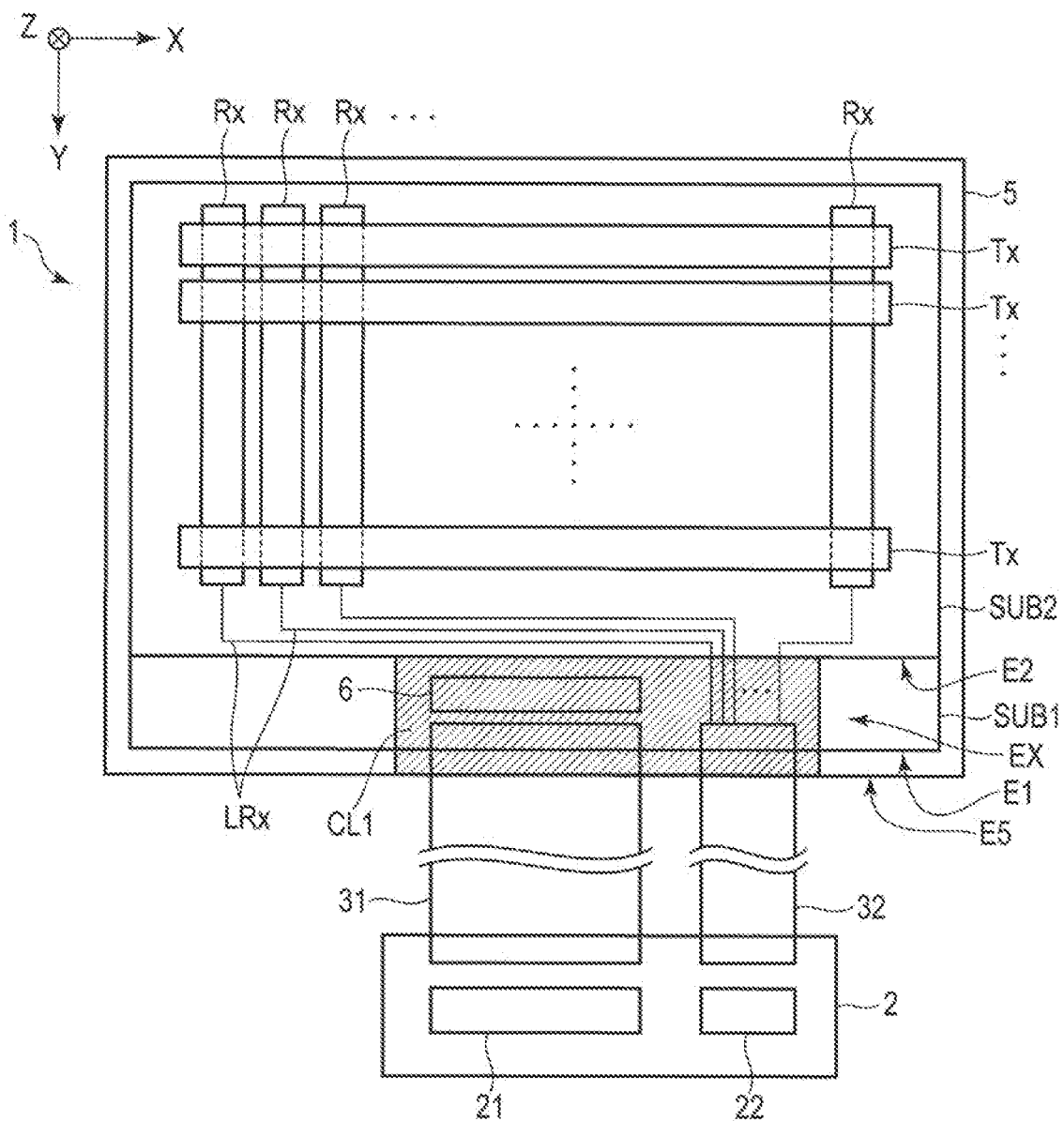
FIG. 8 is a plan view showing a first modified example of the display device 1.
Figure 9:
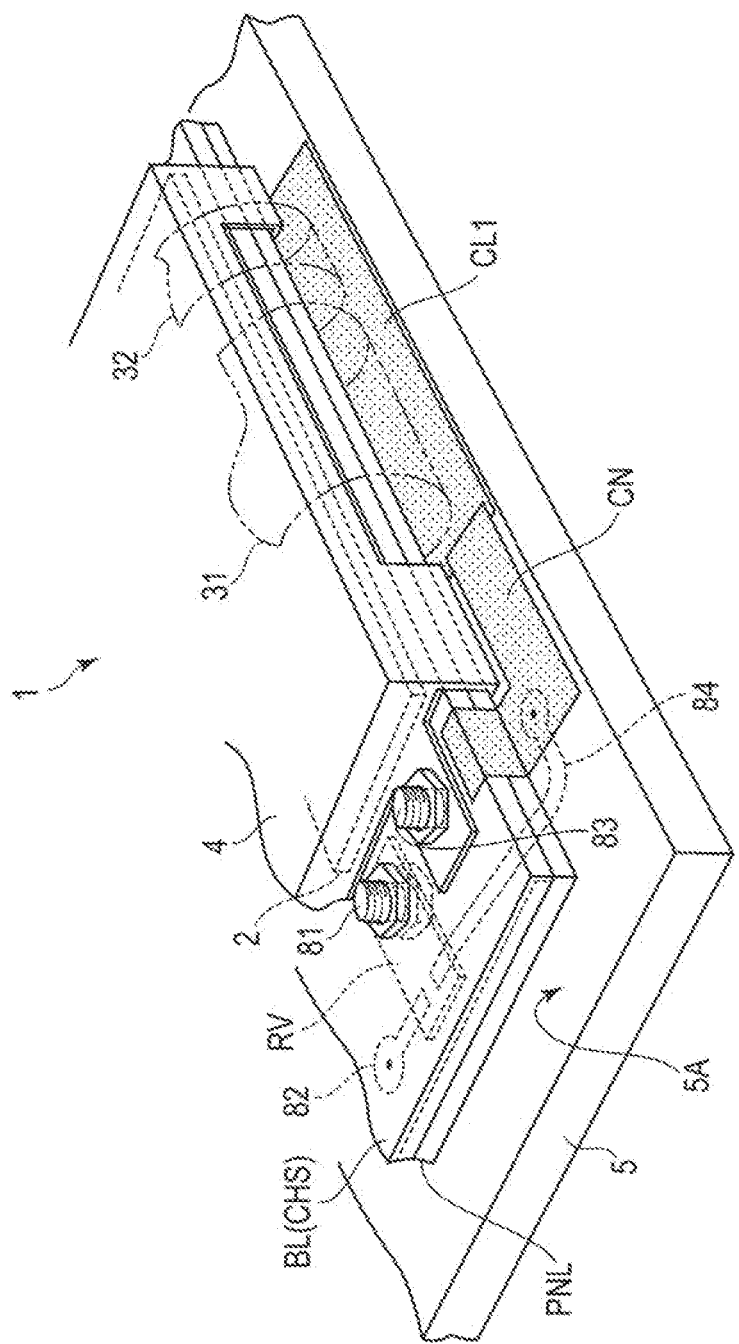
FIG. 9 is a perspective view showing an appearance of the display device 1 of the first modified example.

FIG. 8 is a plan view showing the first modified example of the display device 1. FIG. 9 is a perspective diagram showing an appearance of the display device 1 of the first modified example. As shown in FIG. 8, the first modified example is different from that shown in FIG. 5 in that the conductive layer CL1 overlaps the outer peripheral wiring lines LRx of the sensor SS in plan view. In the example illustrated, the conductive layer CL1 extends along the first direction X in a region between the end portion E2 and the end portion E5 in plan view. The conductive layer CL1 overlaps the outer peripheral wiring lines LRx and the wiring substrate 32 as well.

In the example illustrated, the single conductive layer CL1 overlaps both of the signal driver 6 and the outer peripheral wiring lines LRx, but there may be separated Shield conductive layers which overlap the signal driver 6 and the outer peripheral wiring lines LRx individually. For example, a first shield conductive layer overlaps the signal driver 6, and a second shield conductive layer overlaps the outer peripheral wiring lines LRx. In this case, each of the conductive layers is electrically connected to the housing CHS.

Further, in FIG. 9, the conductive layer CN may be provided on a wiring substrate 32 side of the conductive layer CL1, or may be on both sides of the conductive layer CL1 while interposing the conductive layer CL1 therebetween.

In the first modified example, advantages effect similar to those of the example shown in FIG. 5 can be obtained. Further, according to the first modified example, the conductive layer CL1 overlaps part of the outer peripheral wiring lines LRx and a part of the wiring substrate 32. With this structure, entering of noise to the outer peripheral wiring lines LRx can be suppressed. Therefore, the display quality can be improved and at the same time, the operation of the sensor SS can be stabilized.

Figure 10:
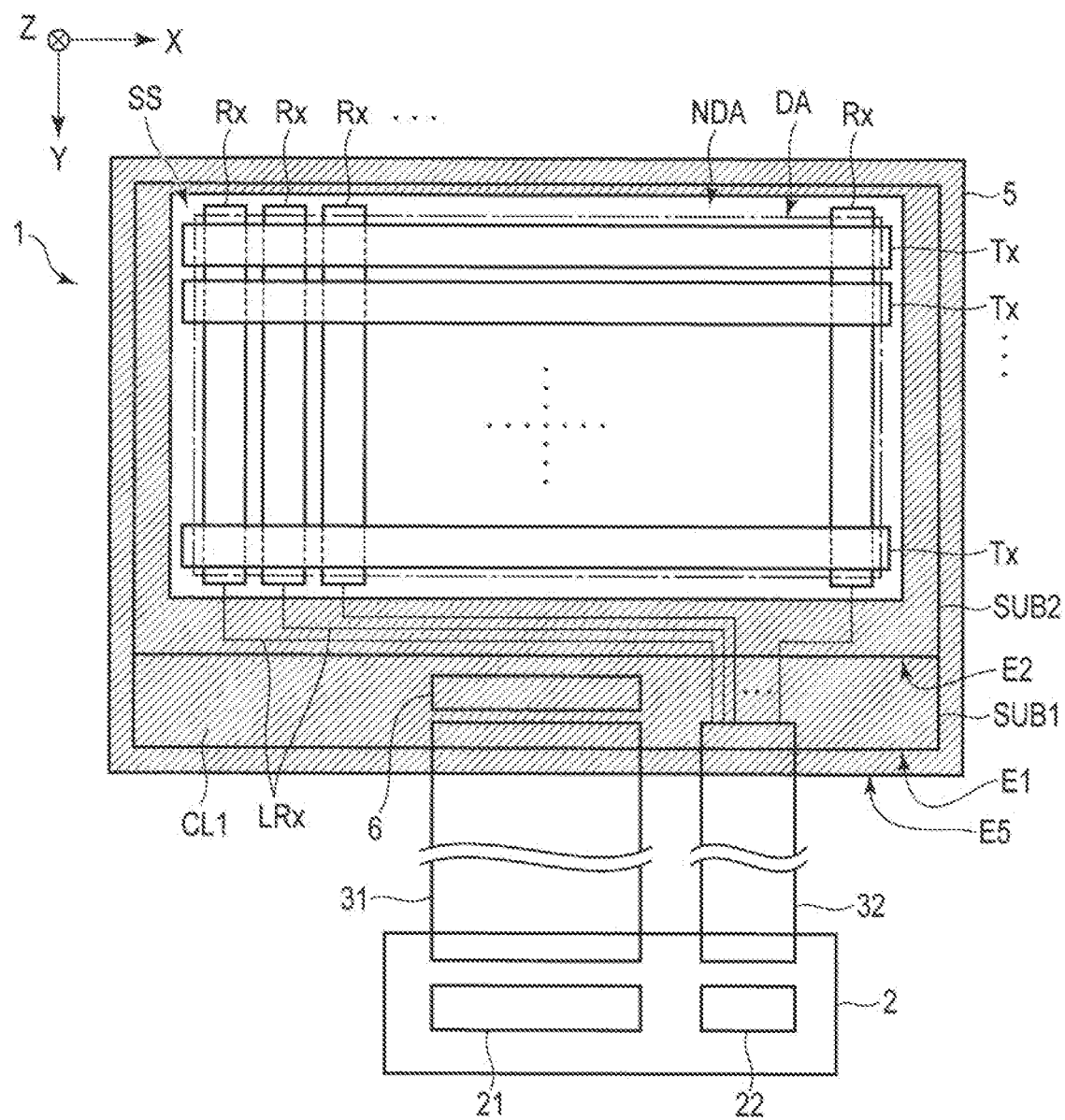
FIG. 10 is a plan view showing a second modified example of the display device 1.
Figure 11:
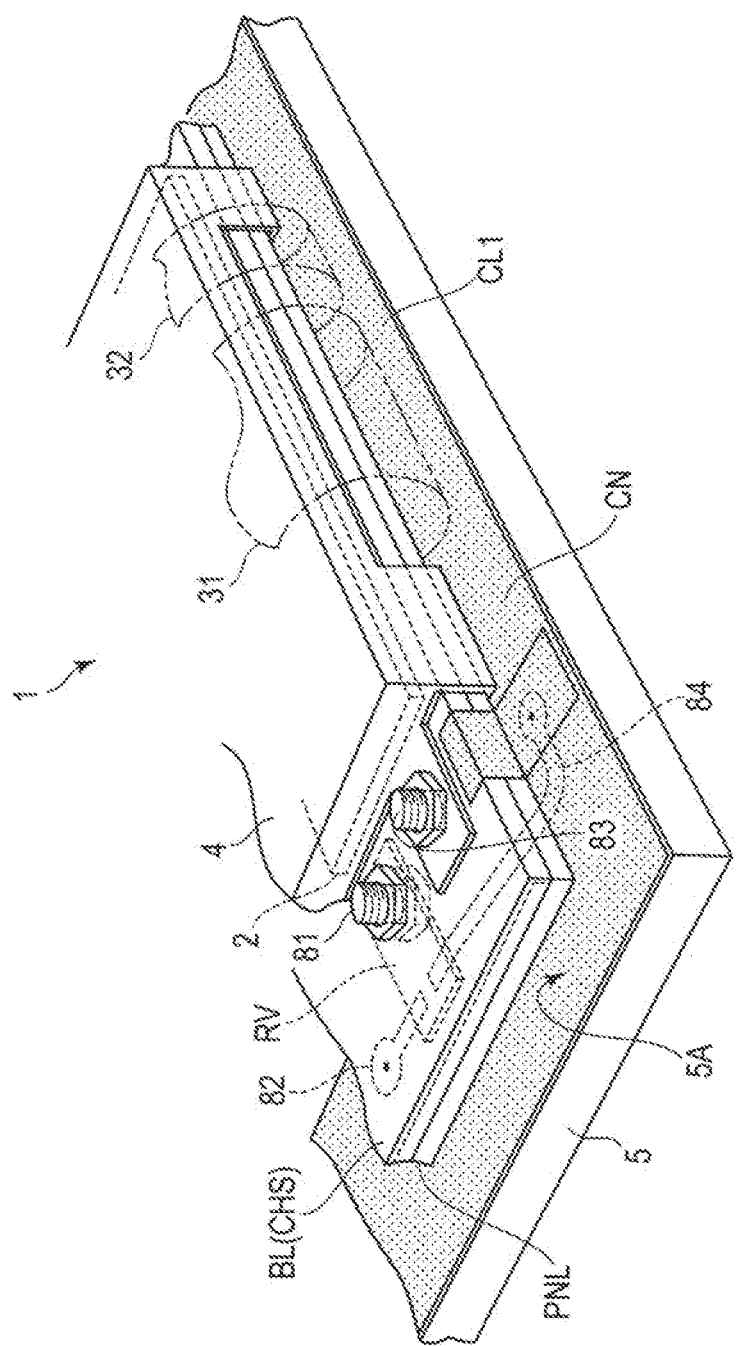
FIG. 11 is a perspective view showing an appearance of the display device 1 of the second modified example.

FIG. 10 is a plan view showing the second modified example of the display device 1. FIG. 11 is a perspective diagram showing an appearance of the display device 1 of the second modified example. As shown in FIG. 10, the second modified example is different from that shown in FIG. 5 in that the conductive layer CL1 is disposed in a frame-like fashion. More specifically, the conductive layer CL1 is disposed over the entire non-display area NDA. With such structure, the conductive layer CL1 overlaps, in plan view, the scanning lines G and the signal lines S, which are lead out to the non-display area NDA, and the outer peripheral wiring lines LRx. In the example illustrated, the conductive layer CL1 overlaps also the outer peripheral wiring lines LRx extending along the end portion E2. On the other hand, the conductive layer CL1 does not substantially overlap the first electrodes Rx or the second electrodes Tx.

In the second modified example, advantages effect similar to those of the example shown in FIG. 5 can be obtained. Further, the region where the outer peripheral wiring lines LRx and the conductive layer CL1 overlap each other is larger than that of the first modified example, and therefore the entering of noise to the outer peripheral wiring lines LRx can be further suppressed. Therefore, the display quality can be improved and at the same time, the operation of the sensor SS can be stabilized.

FIG. 12 is a cross section showing the third modified example of the display device 1. The third modified example is different from that shown in FIG. 2 in that the conductive layer CL1 covers the wiring substrate 31. Along the second direction Y, the conductive layer CL1 is brought into contact partially with the first surface 5A between the end portion E2 and the end portion E5, and also extends to below the control substrate 2. That is, one end portion (first end portion) ECa of the conductive layer CL1 is in contact with the first surface 5A, and another end portion (second end portion) ECb of the conductive layer CL1 is located under the control substrate 2. The first substrate SUB1 and the signal driver 6 are located between the one end portion ECa and the other end portion ECb along the third direction Z. The signal driver 6 and the wiring substrate 31 are located in an inner region surrounded by the conductive layer CL1.

Figure 13:
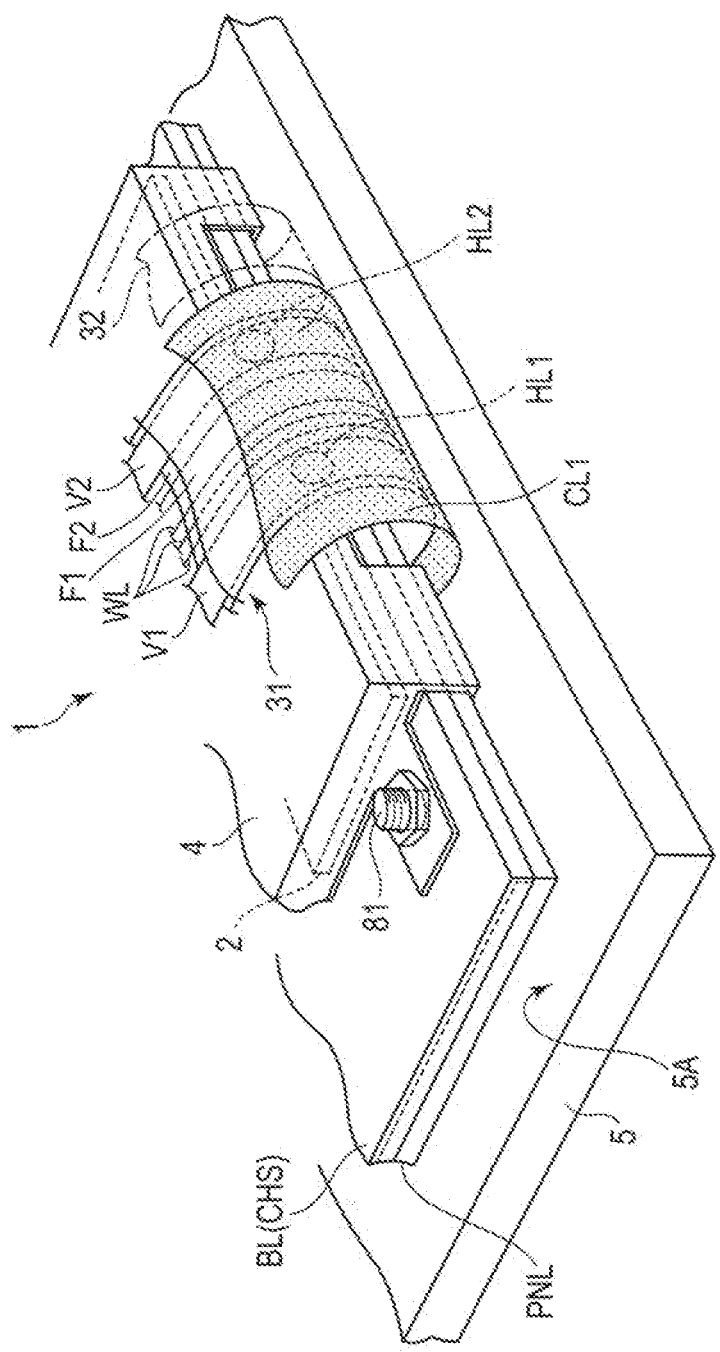
FIG. 13 is a perspective view showing an appearance of the display device 1 of the third modified example.

FIG. 13 is a perspective diagram showing an appearance of the display device 1 of the third modified example.

The wiring substrate 31 comprises wiring lines WL, films F1 and F2 each formed from an insulating material, and reference potential members V1 and V2 each formed from a conductive material. The reference potential members V1 and V2 and the wiring lines WL are sandwiched between the film F1 and the film F2. The reference potential members V1 and V2 are at the same potential and both are fixed to the ground potential. The wiring lines WL are located between the reference potential member V1 and the reference potential member V2 and are electrically connected the first electrode Rx and the IC chip 22. In the example illustrated, the film F1 comprises a through hole HL1 to expose the reference potential member V1 and a through hole HL2 to expose the reference potential member V2.

The conductive layer CL1 is located on an outer side with respect to the wiring substrate 31, so as to cover the wiring substrate 31 to be enclosed therein. The conductive layer CL1 is in contact with the reference potential member V1 in the hole through HL1, and with the reference potential member V2 in the through hole HL2. Thus, the conductive layer CL1 is maintained at the same potential as that of the reference potential members V1 and V2, that is, the ground potential.

In the third modified example, advantages effect similar to those of the example shown in FIG. 2 can be obtained. Further, the signal driver 6 and the wiring substrate 31 are surrounded by the conductive layer CL1, and therefore it is possible to suppress the entering of noise from, for example, the region between the cover member 5 and the first substrate SUB1 (that is, the side surface of the display panel) to the signal driver 6. Moreover, the entering of noise to the wiring substrate 31 can be suppressed. Consequently, flickering of images displayed can be suppressed, thereby improving the display quality of the display device 1.

Figure 14:
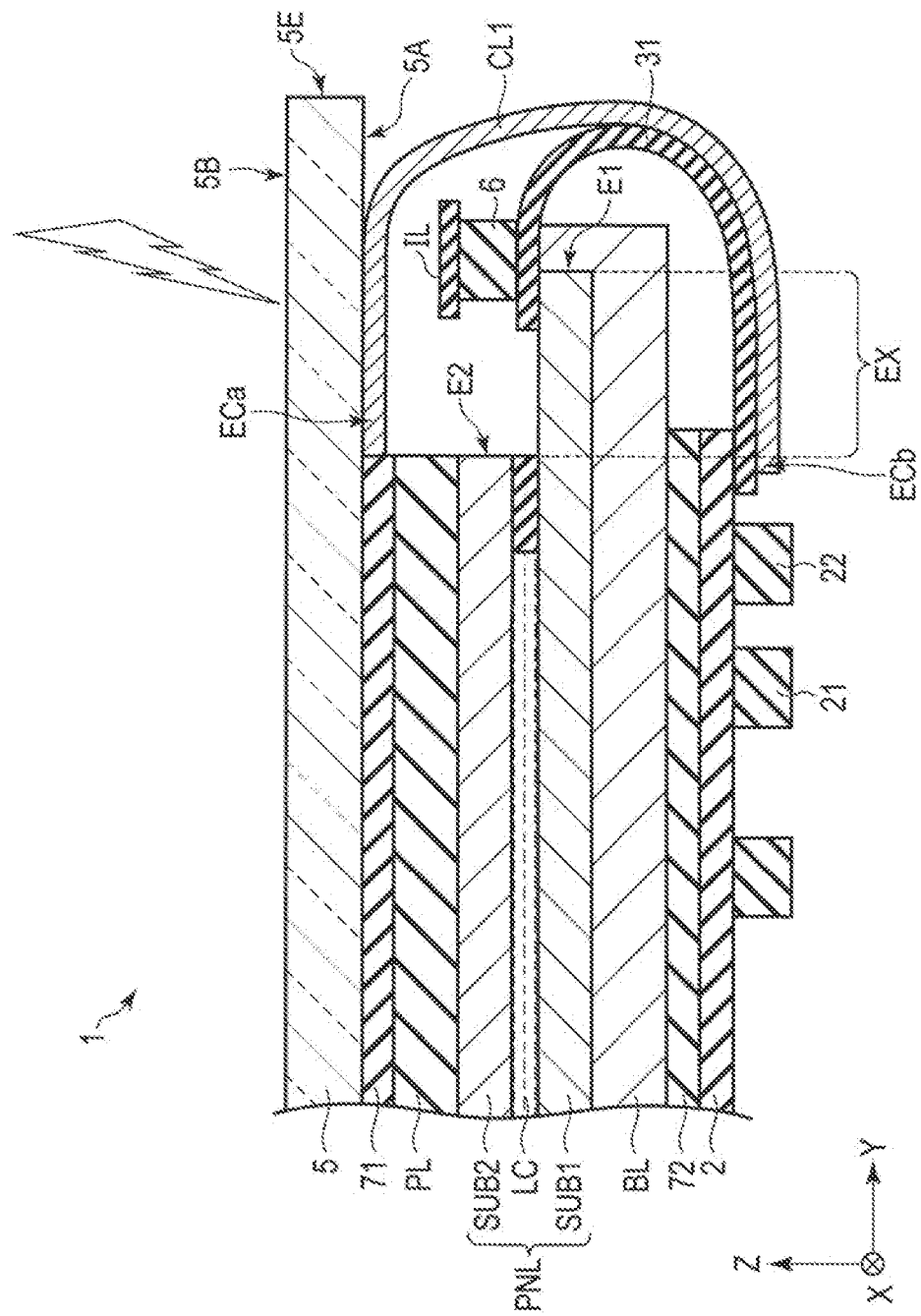
FIG. 14 is a plan view showing a fourth modified example of the display device 1.

FIG. 14 is a cross section showing a fourth modified example of the display device 1. The fourth modified example is different from the third modified example in that the signal driver 6 is mounted on the wiring substrate 31. That is, the signal driver 6 is located between the wiring substrate 31 and the conductive layer CL1 along the third direction Z. In the example illustrated, an insulating layer IL is interposed between the signal driver 6 and the conductive layer CL1. In FIG. 14, the insulating layer IL is provided on the upper surface of the signal driver 6, but it may extend to a position exceeding the other end portion ECb of the conductive layer CL1. Moreover, the signal driver 6 may be provided on the wiring substrate 31 and under the display panel PNL. The conductive layer CL1 is connected to the reference potential members V1 and V2 as in the example shown in FIG. 13.

In this example, advantages effect similar to those of the third modified example can be obtained. Further, with the insulating layer IL thus provided, contacting between the signal driver 6 and the conductive layer CL1 can be prevented. Thus, short-circuiting between the signal driver 6 and the conductive layer CL1 is prevented and the operation of the signal driver 6 can be stabilized. Consequently, the display quality of the display device 1 can be improved.

FIG. 15 is a cross section showing a fifth modified example of the display device 1. The fifth modified example is different from the example shown in FIG. 2 in that the display device 1 further comprises a conductive layer CL2. The conductive layer CL2 is in contact with the conductive layer CL1 and extends to below the control substrate 2. That is, one end portion ECc of the conductive layer CL2 is in contact with the conductive layer CL1, and another end portion ECd of the conductive layer CL2 is located below the control substrate 2. The first substrate SUB1 and the signal driver 6 are located between the one end portion ECc and the other end portion ECd along the third direction Z. The signal driver 6 and the wiring substrate 31 are located within an inner region surrounded by the conductive layer CL1 and the conductive layer CL2.

As in the case of the example shown in FIG. 6 or 7, the conductive layer CL1 is electrically connected to the housing CHS of the illumination unit BL. The conductive layer CL2 may be electrically connected to the reference potential members V1 and V2 of the wiring substrate 31 as in the example shown in FIG. 13. Further, the signal driver 6 may be mounted on the wiring substrate 31 as in the fourth modified example. In the fifth example, advantages effect similar to those of the third modified example can be obtained.

Figure 16:
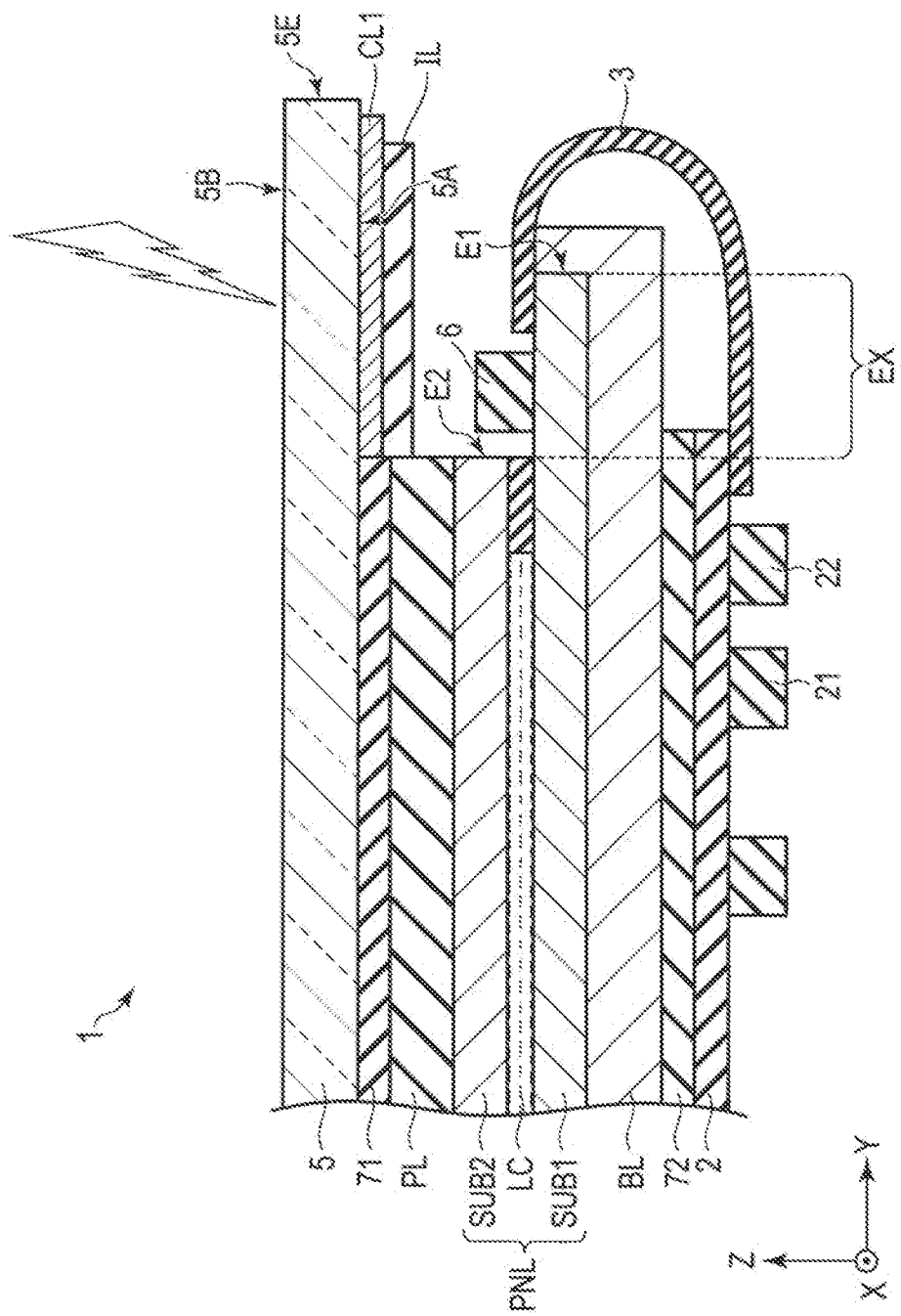
FIG. 16 is a plan view showing a sixth modified example of the display device 1.

FIG. 16 is a cross section showing a sixth modified example of the display device 1. The sixth modified example is different from the example shown in FIG. 2 in that an insulating layer IL is provided between the signal driver 6 and the conductive layer CL1. As in the example shown in FIG. 6 or 7, the conductive layer CL1 is electrically connected to the housing CHS of the illumination unit BL.

The insulating layer IL overlaps at least the entire driver 6 along the third direction Z. In the example illustrated, the insulating layer IL is in contact with the conductive layer CL1. The insulating layer IL has substantially the same size that of the conductive layer CL1 and overlaps the extension portion EX as well.

In the sixth modified example, advantages effect similar to those of the example shown in FIG. 2 can be obtained. Further, according to the sixth modified example, contacting between the signal driver 6 and the conductive layer CL1 can be prevented. Thus, short-circuiting between the signal driver 6 and the conductive layer CL1 is prevented and the operation of the signal driver 6 can be stabilized. Consequently, the display quality of the display device 1 can be improved.

Figure 17:
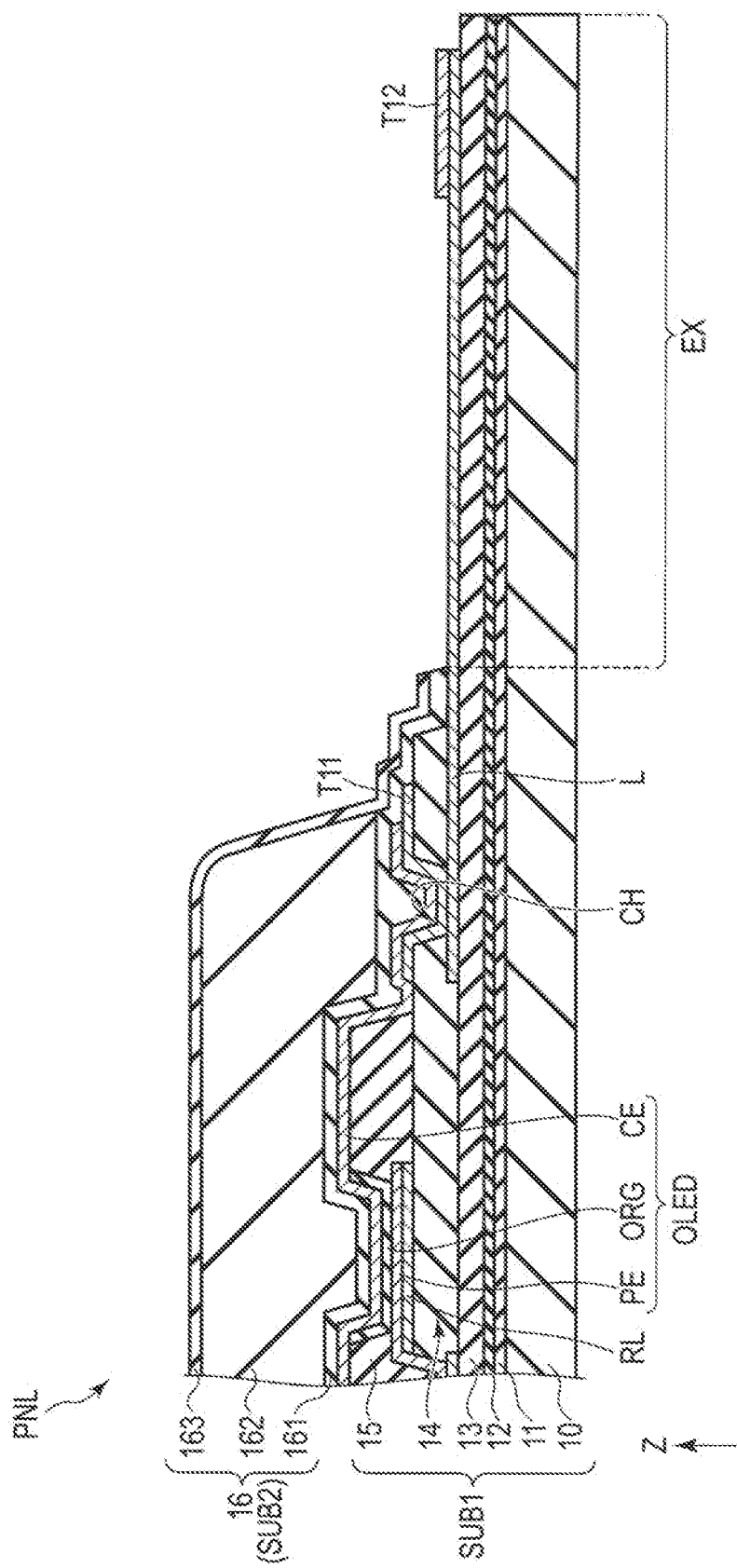
FIG. 17 is a cross-sectional view showing another example of the display panel PNL shown in FIG. 2.

FIG. 17 is a cross-sectional view showing another configuration example of the display panel PNL shown in FIG. 2. The example shown in FIG. 17 is different from that shown in FIG. 2 in that the display panel PNL comprises an organic EL device as the display element. The other structures of the display device 1 are similar to those of FIGS. 2, 3, 5 to 16, 18, and 19.

The display panel PNL comprises an insulating substrate 10, first to fifth insulating films 11 to 15, a reflective layer RL, an organic EL device OLED, a sealing film 16, a wiring line L, terminals T11 and T12, etc.

For example, the insulating substrate 10 is formed from an organic insulating material such as polyimide. The insulating substrate 10 may be formed from a transparent insulating material such as resin or glass. The first to fourth insulating films 11 to 14 are stacked on the insulating substrate 10 in this order. Although the details will be omitted, a semiconductor layer of the switching element for driving the organic EL device OLED is formed on the first insulating film 11, a gate electrode is formed on the second insulating film 12, and a source electrode and a drain electrode are formed on the third insulating film 13. The first to third insulating films 11 to 13 are each formed from, for example, an inorganic insulating material such as silicon oxide, silicon nitride or silicon oxynitride. The fourth insulating film 14 is formed from an organic insulating material.

The organic EL device OLED is formed on the fourth insulating film 14. In the example illustrated, the organic EL device OLED is of the so-called top emission type, which emits light to an opposite side to the insulating substrate 10, but the type is not limited to that of this example. It may be of the so-called bottom emission type, which emits light to the insulating substrate 10 side. The organic EL device OLED comprises a pixel electrode PE, a common electrode CE and an organic emitting layer ORG.

A pixel electrode PE is provided on the fourth insulating film 14. The pixel electrode PE functions as, for example, a positive electrode of the organic EL device OLED. The pixel electrode PE is electrically connected to the switching element (not shown). The organic emitting layer ORG is formed on the pixel electrode PE. The organic emitting layer ORG may further comprise an electron-injection layer, a hole-injection layer, an electron-transport layer, a hole-transport layer and the like, to improve light-emission efficiency. The common electrode CE is formed on the organic emitting layer ORG. The common electrode CE functions as, for example, a negative electrode of the organic EL device OLED. The common electrode CE and the pixel electrodes PE are formed from, for example, a transparent conductive material such as indium-tin-oxide (ITO) or indium-zinc-oxide (IZO). The organic emitting layer ORG emits light at the brightness according to voltage (or current) applied between the pixel electrode PE and the common electrode CE.

In the case of a top emission type, as shown in FIG. 17, the organic EL device OLED should preferably include a reflective layer RL between the fourth insulating film 14 and the pixel electrode PE. The reflective layer RL is formed from, for example, a highly reflective metal material such as aluminum or silver.

The organic EL device OLED of each pixel PX is formed by partition with fifth insulating films (ribs) 15 of an organic insulating material. In the example illustrated, the common electrode CE is in contact with the organic emitting layer ORG and also with the fifth insulating film 15.

The sealing film 16 covers the organic EL device OLED. The sealing film 16 inhibits the entering of moisture or oxygen to the organic EL device OLED, thereby suppressing degradation of the organic EL device OLED. For example, the sealing film 16 comprises a first inorganic film 161, an organic layer 162 and a second inorganic film 163. The first inorganic film 161 is formed on the organic EL device OLED. In the example illustrated, the first inorganic film 161 is in contact with the common electrode CE. The second inorganic film 163 is located above the first inorganic film 161. The organic layer 162 is located between the first inorganic film 161 and the second inorganic film 163 and is in contact with these films.

In this example, the structure from the insulating substrate 10 to the common electrode CE is equivalent to the first substrate SUB1 shown in FIG. 2. The sealing film 16 is equivalent to the second substrate SUB2 shown in FIG. 2. That is, the extension portion EX in this example is equivalent to a portion of the display panel PNL, which extends further from the sealing film 16. The entirety of each of the fourth insulating film 14 and the fifth insulating film 15 overlaps the sealing film 16 along the third direction Z. On the other hand, the insulating substrate 10 and the first to third insulating films 11 to 13 extend further from the sealing film 16 along the second direction Y, so as to form the extension portion EX.

The wiring line L is formed on the third insulating film 13. One end of the wiring line L is covered by the fourth insulating film 14, whereas the other end of the wiring line L is located in the extension portion EX. A terminal T11 is formed on the fourth insulating film 14. The terminal T11 passes through the contact hole CH formed in the fourth insulating film 14, so as to be in contact with the wiring line L. The common electrode CE extends to an extension portion EX side with respect to the organic EL device OLED, and is in contact with the terminal T11. Thus, the wiring line L and the organic EL device OLED are electrically connected to each other. A terminal T12 is formed on the other end side of the wiring line L. The signal driver 6 described above is connected to, for example, the terminal T12. If needed, a protective film may be formed to cover the wiring line L.

FIG. 18 is a plan view schematically showing a mutual-capacitive touch detection device 200 to be applied to the display device 1.

The touch detection device 200 comprises a sensor SS and an IC chip 22. As mentioned before, the sensor SS comprises second electrodes Tx (Tx1, Tx2, Tx3, . . . ) as drive electrodes, and first electrodes Rx (Rx1, Rx2, Rx3, . . . ) as detection electrodes, insulated from the second electrodes Tx and arranged so as to cross the second electrodes Tx. At each of the intersections between the second electrodes Tx and the first electrode Rx, a capacitance is formed.

In the display panel PNL, the common electrode to which a certain potential is applied during a display period may be utilized as the second electrodes Tx described above. To explain, in the so-called in-cell type display device, the second electrodes Tx (Tx1, Tx2, Tx3, . . . ) are used as a common electrode for the pixel circuits during a display period. In the so-called on-cell type display device, the second electrodes Tx and the first electrodes Rx are provided as electrodes exclusively used for touch detection on the touch panel (touch detection substrate) provided for touch detection. The touch detection device 200 is controlled by the IC chip 22.

The touch detection period is set, for example, dispersedly in one frame. Therefore, in the display device, the display period and the touch detection period are time-shared. A selector SELA supplies pulse-like drive signals Txs sequentially to the second electrodes Tx1, Tx2, Tx3, . . . , respectively during the touch detection period. If a finger of the user is in contact (touching) with a certain region, detection signals Rxs output from detection electrodes in an applicable touched location become lower in level than detection signals Rxs output from other detection electrodes. The figure illustrates the case where the level of the detection signals when not detecting a touch is AP1 and the case where the level of the detection signals of the electrodes detecting a touch is AP2 (<AP1).

Figure 19:
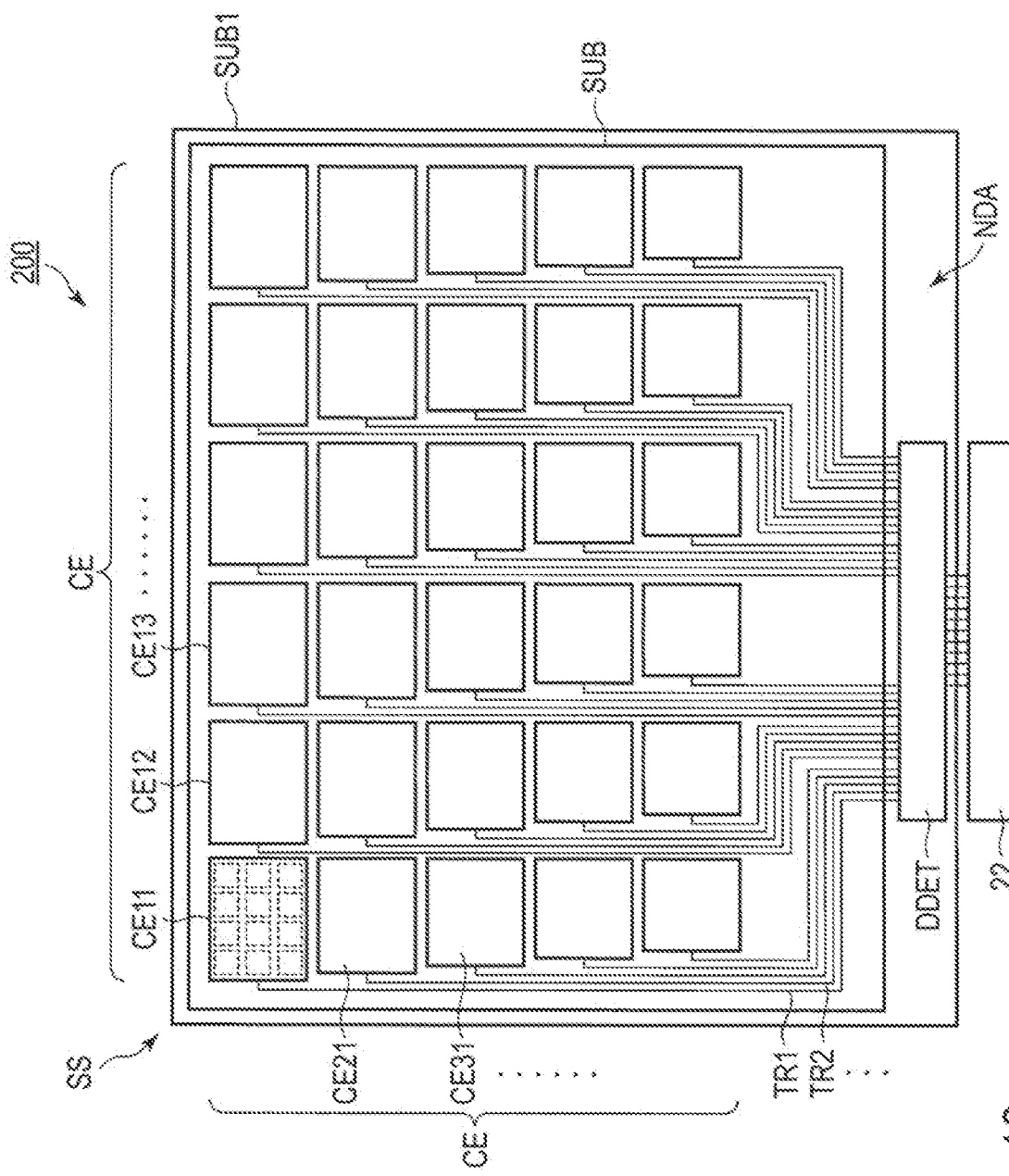
FIG. 19 is a plan view schematically showing a touch detection device of a self-capacity system applied to the display device 1.

FIG. 19 is a plan view schematically showing a self-capacitive touch detection device 200 to be applied to the display device 1. The touch detection device 200 comprises a sensor SS, an IC chip 22 and a drive-detect circuit DDET. In the self-capacitive type, the sensor SS comprises a plurality of common electrodes CE (CE11, CE12, CE13, . . . , CE21, CE22, CE23, . . . , CE31, CE32, CE33, . . . ) arranged, for example, in a matrix for detecting touch operations. To the common electrodes CE, outer peripheral wiring lines TR (TR1, TR2, . . . ) are connected, respectively. The outer peripheral wiring lines TR are connected to a drive-detect circuit DDET. The drive-detect circuit DDET is formed, for example, in the non-display area NDA of the first substrate (array substrate) SUB1 of the display panel PNL. The drive-detect circuit DDET is controlled by the IC chip 22, so as to control the touch detection function. Note that the area of one common electrode CE is, for example, about 24 times of that of one pixel region.

The above-provided description is directed to an example in which the common electrodes CE arranged in a matrix are used as electrodes of the self-capacitive type, but each of the first electrodes Rx and the second electrodes Tx shown in FIG. 18 may be used as a self-capacitive electrode. For example, the touch detection device 200 may use only the second electrodes Tx or only the first electrodes Rx to operate as the self-capacitive type. Such operation is performed, for example, in a power saving mode. The first electrodes Rx shown in FIG. 5, 8 or 10 may be used for a self-capacitive electrode detection. The first electrodes Rx may be arranged in a matrix on the second substrate SUB2, and the first electrodes Rx may be controlled by the IC chip 22 via the peripheral wiring lines LRx and the wiring substrate 32. The IC chip 22 may be disposed on the wiring substrate 32 or built in the signal driver 6. In this case, the sensor SS may use only the first electrodes Rx so as to operate as the self-capacitive type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate;
a second substrate opposing the first substrate;
a first wiring substrate connected to the first substrate;
a second wiring substrate connected to the second substrate;
a cover member located on an opposite side to the first substrate so as to interpose the second substrate therebetween; and
a conductive layer,
the first substrate comprising an extension portion extending further from the second substrate,
the first wiring substrate being connected to the extension portion of the first substrate,
the second wiring substrate being connected to the extension portion to supply a signal to the second substrate,
the cover member comprising a first surface opposing the extension portion,
the conductive layer overlapping the first wiring substrate, the second wiring substrate, and the extension portion in plan view.

2. The display device of claim 1, wherein
the conductive layer is maintained at a predetermined potential.

3. The display device of claim 1, further comprising:
a driver provided in the extension portion,
wherein
the conductive layer overlaps the driver at least partially in plan view.

4. The display device of claim 3, wherein
the conductive layer overlaps the driver entirely in plan view.

5. The display device of claim 3, further comprising:
an insulating layer located between the driver and the conductive layer.

6. The display device of claim 1, wherein
the conductive layer covers the first wiring substrate and the second wiring substrate.

7. The display device of claim 1, wherein
the first wiring substrate further comprises a reference potential member, and
the conductive layer is in contact with the reference potential member.

8. The display device of claim 1, further comprising:
an adhesive layer located between the second substrate and the cover member,
wherein
the conductive layer is in contact with the adhesive layer.

9. The display device of claim 1, further comprising:
an illumination unit accommodated in a housing,
wherein
the illumination unit is located on an opposite side to the second substrate so as to interpose the first substrate therebetween,
the housing is at a reference potential, and
the conductive layer is electrically connected to the housing.

10. The display device of claim 1, further comprising:
a sensor comprising a detection electrode and an outer peripheral wiring line electrically connected to the detection electrode,
wherein
the conductive layer overlaps the outer peripheral wiring line at least partially in plan view.

11. A display device comprising:
a first substrate;
a second substrate opposing the first substrate;
a wiring substrate connected to the first substrate;
a cover member located on an opposite side to the first substrate so as to interpose the second substrate therebetween;

a first conductive layer; and
a second conductive layer,
the first substrate comprising an extension portion extending further from the second substrate,
the wiring substrate being connected to the extension portion,
the cover member comprising a first surface opposing the extension portion,
the first conductive layer overlapping the extension portion in plan view,
one end of the second conductive layer being connected to the first conductive layer,
another end of the second conductive layer being connected to the wiring substrate.

12. The display device of claim 11, wherein
the first conductive layer and the second conductive layer are maintained at a predetermined potential.

13. The display device of claim 11, further comprising:
a driver provided in the extension portion,
wherein
the first conductive layer overlaps the driver at least partially in plan view.

14. The display device of claim 13, wherein
the first conductive layer overlaps the driver entirely in plan view.

15. The display device of claim 13, further comprising:
an insulating layer located between the driver and the first conductive layer.

16. The display device of claim 11, wherein
the first conductive layer covers the wiring substrate.

17. The display device of claim 11, wherein
the wiring substrate further comprises a reference potential member, and
the first conductive layer is in contact with the reference potential member.

18. The display device of claim 11, further comprising:
an adhesive layer located between the second substrate and the cover member,
wherein
the first conductive layer is in contact with the adhesive layer.

19. The display device of claim 11, further comprising:
an illumination unit accommodated in a housing,
wherein
the illumination unit is located on an opposite side to the second substrate so as to interpose the first substrate therebetween,
the housing is at a reference potential, and
the first conductive layer is electrically connected to the housing.

20. The display device of claim 11, further comprising:
a sensor comprising a detection electrode and an outer peripheral wiring line electrically connected to the detection electrode,
wherein
the first conductive layer overlaps the outer peripheral wiring line at least partially in plan view.

* * * * *